United States Patent
Cho

(10) Patent No.: US 7,940,560 B2
(45) Date of Patent: May 10, 2011

(54) MEMORY CELLS, MEMORY DEVICES AND INTEGRATED CIRCUITS INCORPORATING THE SAME

(75) Inventor: Hyun-Jin Cho, Palo Alto, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/128,901

(22) Filed: May 29, 2008

(65) Prior Publication Data

US 2009/0296463 A1 Dec. 3, 2009

(51) Int. Cl.
*G11C 11/34* (2006.01)
(52) U.S. Cl. ........................ 365/180; 365/174
(58) Field of Classification Search .................. 365/180, 365/174; 257/107, 133, 146; 438/135
See application file for complete search history.

(56) References Cited

U.S. PATENT DOCUMENTS

| | | | |
|---|---|---|---|
| 3,918,033 A * | 11/1975 | Case et al. ..................... | 365/180 |
| 6,448,122 B1 | 9/2002 | de Muizon et al. | |
| 6,703,646 B1 | 3/2004 | Nemati et al. | |
| 6,713,791 B2 * | 3/2004 | Hsu et al. ....................... | 257/200 |
| 6,781,888 B1 | 8/2004 | Horch et al. | |
| 6,967,358 B2 * | 11/2005 | Nemati et al. ................. | 257/133 |
| 7,042,027 B2 | 5/2006 | Bhattacharyya | |
| 7,125,753 B1 | 10/2006 | Horch et al. | |
| 7,148,522 B2 * | 12/2006 | Quek et al. ..................... | 257/140 |
| 7,195,959 B1 | 3/2007 | Plummer et al. | |
| 2004/0041212 A1 | 3/2004 | Bhattacharyya | |
| 2005/0233506 A1 | 10/2005 | Horch et al. | |
| 2006/0146638 A1 | 7/2006 | Chang et al. | |
| 2006/0198181 A1 | 9/2006 | Luk et al. | |
| 2006/0285420 A1 | 12/2006 | Kim et al. | |
| 2007/0051973 A1 | 3/2007 | Yamamura | |
| 2007/0138501 A1 | 6/2007 | Sugizaki et al. | |
| 2009/0086436 A1 | 4/2009 | Kluge | |
| 2009/0086537 A1 * | 4/2009 | Kitagawa ....................... | 365/180 |

FOREIGN PATENT DOCUMENTS

WO   2005114742 A2   12/2005

OTHER PUBLICATIONS

Wolf, "Silicon Processing for the VLSI Era vol. 2: Process Integration", Lattice Press pp. 381-385 (1990).
Nemati, et al., "A Novel Thyristor-Based SRAM Cell (T-RAM) for High-Speed, Low Voltage, Giga-scale Memories", IEEE (1999).
Nemati F., et al. "A novel thyristor-based SRAM cell (T-RAM) for high-speed, low-voltage, giga-scale memories," Electron Devices Meeting, 1999. IEDM Technical Digest. International Washington, D.C., USA Dec. 5-8, 1999, Piscataway, NJ, USA, IEEE, US, Dec. 5, 1999 pp. 283-286.
International Search Report for PCT/US2009/003245 mailed Oct. 22, 2009.

\* cited by examiner

*Primary Examiner* — Son Dinh
*Assistant Examiner* — Eric Wendler
(74) *Attorney, Agent, or Firm* — Ingrassia Fisher & Lorenz, P.C.

(57) ABSTRACT

A memory device is provided which includes a write bit line, a read bit line, and at least one memory cell. The memory cell includes a write access transistor, a read access transistor coupled to the read bit line and to the first write access transistor, and a gated-lateral thyristor (GLT) device coupled to the first write access transistor. Among its many features, the memory cell prevents read disturbances during read operations by decoupling the read and write bit lines.

26 Claims, 20 Drawing Sheets

MEMORY CELLS, MEMORY DEVICES AND INTEGRATED CIRCUITS INCORPORATING THE SAME

TECHNICAL FIELD

Embodiments of the present invention relate generally to semiconductor memory devices. More particularly, embodiments of the present invention relate to gated lateral thyristor-based random access memory (GLTRAM) memory cell structures and memory devices which implement such GLTRAM memory cells, and methods of fabricating the same.

BACKGROUND

Integrated circuit memories include static random access memory (SRAM). Many SRAM cell structures utilize six-transistor or eight-transistor memory cells. The large layout areas associated with such six-transistor and eight-transistor memory cells which are used in many implementations of SRAM cells has limited the design of high density SRAM devices.

Given these drawbacks, there have been attempts to build a thyristor-based memory cell with a simple layout and reduced layout area in comparison to conventional memory cells. A thrysitor is a bi-stable, three terminal device which consists of a four layer structure including a P-type anode region, an N-type base region, a P-type base region coupled to a gated electrode, and an N-type cathode region arranged in a PNPN configuration. PN junctions are formed between the P-type anode region and the N-type base region, between the N-type base region and the P-type base region, and between the P-type base region and the N-type cathode region. Contacts are made to the P-type anode region, the N-type cathode region, and the P-type base region.

F. Nemati and J. D. Plummer have disclosed a two-device thyristor-based SRAM (T-RAM) cell that includes an access transistor and a gate-assisted, vertical PNPN thyristor, where the vertical thyristor is operated in a gate-enhanced switching mode. See F. Nemati and J. D. Plummer, A Novel Thyristor-based SRAM Cell (T-RAM) for High-Speed, Low-Voltage, Giga-scale Memories, Center for Integrated Systems, Stanford University, Stanford, Calif., 1999. The performance of the T-RAM cell depends on the turn-off characteristics of the vertical thyristor. The turn-off characteristics depend on the stored charge and carrier transit time in the P-type base region of the PNPN thyristor. By reverse biasing the thyristor for a write-zero operation and by using a gated electrode to assist with turn-off switching of the vertical thyristor to discharge the stored charge the turn-off characteristics for the vertical thyristor are improved from milliseconds to nanoseconds.

FIG. 1 is a circuit schematic 100 which illustrates an array of conventional thyristor-based Random Access Memory (T-RAM) cells including T-RAM cell 110.

As shown in FIG. 1, T-RAM cell 110 consists of word lines 120, 130, a common bit line 150, a Thin Capacitively-Coupled Thyristor (TCCT) device 160 in series with an NMOS access transistor 170. The TCCT device 160 provides an active storage element which comprises a thyristor 162 and a capacitor 165 coupled to the gate of the thyristor 162. The NMOS access transistor 170 is coupled between a cathode node 146 of the TCCT device 160 and the common bit line 150. An anode node 148 of the TCCT device 160 is fixed at a positive bias. The TCCT device 160 exhibits a bi-stable current-versus-voltage (I-V) characteristic. The bi-stable current-versus-voltage characteristic results in a wide read margin between logical one (1) and logical zero (0) data states because the on/off current ratio between two states are greater than $1\times10^5$. See F. Nemati et al. The bi-stable current-versus-voltage characteristic results in good read current because at a logical one (1) data state, the TCCT device 160 is in forward diode mode resulting in higher current. To store a logical one (1) in the T-RAM cell 110, a constant current greater than a standby or holding current is applied through the TCCT device 160 and the NMOS access transistor 170. The current from each of the memory cells is collected through the common bit line 150. During the read operation, the voltage level on the common bit line 150 must be maintained at a certain level (e.g., ground or one-half (Vdd)). If current flows from each of the memory cells connected to the common bit line 150, the voltage level on the common bit line 150 will fluctuate. This can cause the read operation to be disturbed (also referred to as a "read disturbance" problem) since the voltage level on the common bit line 150 is changed by both the selected cell as well as the amount of leakage current from the unselected cells.

FIG. 2 is a circuit schematic 200 which illustrates an array of conventional Thin Capacitively-Coupled Thyristor (TCCT)-DRAM cells including TCCT-DRAM cells 210, 270. In contrast to conventional DRAM cells, which usually include a MOSFET device and a capacitor, the TCCT-DRAM cell 210 consists of a single TCCT device 260 and three controls lines including a write enable line 230, word line 240, and a bit line 250. Notably, the TCCT-DRAM cell 210 does not require an access transistor. The TCCT device 260 consists of a thyristor 262 which includes an anode node 248 connected to the bit line 250, a cathode node 246 connected to the word line 240, and a gate capacitor 265 connected directly above a P-base region (not shown) of the thyristor 262 to a gate line which functions as the write enable line 230. The TCCT-DRAM cell 210 is operated using basic read/write operations which include a standby mode, a write logic one (1) operation, a write logic zero (0) operation, and a read operation.

In standby mode, both bit line 250 and word line 240 are at Vdd, and the stored data is maintained by a charge state of the P-base region of thyristor. The word line 240 in TCCT DRAM activates the TCCT cells connected along the write enable line 230. During a write logic one (1) operation, the voltage applied on the bit line 250 is kept high and the write enable line 230 is pulsed while word line 240 is held at ground level, triggering the TCCT device 260 to latch. The bias scheme for write zero (0) operation is the same as the write one (1) operation except that the voltage applied on the bit line 250 is kept low so that the pulsing of the write enable line 230 switches the TCCT device 260 into its blocking state. During a read operation, the word line 240 is held low and the change in the voltage or the current of the bit line 250 is read into a sense amplifier.

During a standby mode or "holding period," which occurs after the write zero (0) operation, the P-base region (not shown) of the thyristor is negatively charged and the potential of the P-base region gradually increases due to a reverse leakage current that flows from the anode node 248 to the cathode node 246. Because of this leakage current the TCCT-DRAM cell 210 must be periodically refreshed during operation to reset the charge state of the TCCT-DRAM cell 210. The refresh operation involves reading a stored value from the TCCT-DRAM cell 210 and then writing the stored value back to the TCCT-DRAM cell 210.

Accordingly, there is a need for memory devices and memory cell structures which have a small memory cell size and fast operational speed, and for methods for fabricating such memory devices and memory cell structures. It would be desirable if such memory devices and memory cell structures can also eliminate the need to perform a periodic refresh operation. It would also be desirable if such memory devices and memory cell structures can reduce and/or eliminate problems such as read disturbance that can occur during read operations.

BRIEF SUMMARY

According to one embodiment, a memory device is provided which includes a write bit line, a read bit line, and at least one memory cell. The memory cell includes a write access transistor, a read access transistor coupled to the read bit line and to the first write access transistor, and a gated-lateral thyristor (GLT) device coupled to the first write access transistor. Among its many features, the memory cell prevents read disturbances during read operations by decoupling the read and write bit lines.

BRIEF DESCRIPTION OF THE DRAWINGS

A more complete understanding of the present invention may be derived by referring to the detailed description and claims when considered in conjunction with the following figures, where:

FIGS. 5, 7, 8, 10-11, 13-14, and 16-21 illustrate, in cross section, a memory cell of FIG. 24 and method steps for its fabrication in accordance with the various embodiments of the invention;

FIGS. 6, 9, 10, 12, and 25 illustrate, in top plan view, the memory cell of FIG. 24 and method steps for its fabrication in accordance with various embodiments of the invention.

DETAILED DESCRIPTION

The following detailed description is merely exemplary in nature and is not intended to limit the invention or the application and uses of the invention. The word "exemplary" is used herein to mean "serving as an example, instance, or illustration." Any embodiment described herein as "exemplary" is not necessarily to be construed as preferred or advantageous over other embodiments. All of the implementations described below are exemplary implementations provided to enable persons skilled in the art to make or use the invention and are not intended to limit the scope of the invention which is defined by the claims. Furthermore, there is no intention to be bound by any expressed or implied theory presented in the preceding technical field, background, brief summary or the following detailed description.

For the sake of brevity, conventional techniques related to transistor design and manufacturing, the control of memory devices, memory cell programming, memory cell erasing, and other functional aspects of the devices and systems (and the individual operating components of the devices and systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the invention.

The following description refers to elements or nodes or features being "connected" or "coupled" together. As used herein, unless expressly stated otherwise, "connected" means that one element, node or feature is directly joined to (or directly communicates with) another element, node or feature. Likewise, unless expressly stated otherwise, "coupled" means that one element, node or feature is directly or indirectly joined to (or directly or indirectly communicates with) another element, node or feature.

In the description and the claims, numerical ordinals, such as the terms "first," "second," "third," "fourth," if any, may be used for distinguishing between similar elements and not necessarily for describing a particular sequential or chronological order. It is to be understood that the terms so used are interchangeable. Under appropriate circumstances, embodiments of the invention described herein are capable of fabrication or operation in sequences other than those illustrated or otherwise described herein.

Furthermore, the terms "comprise," "include," "have," and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

Figure 1:
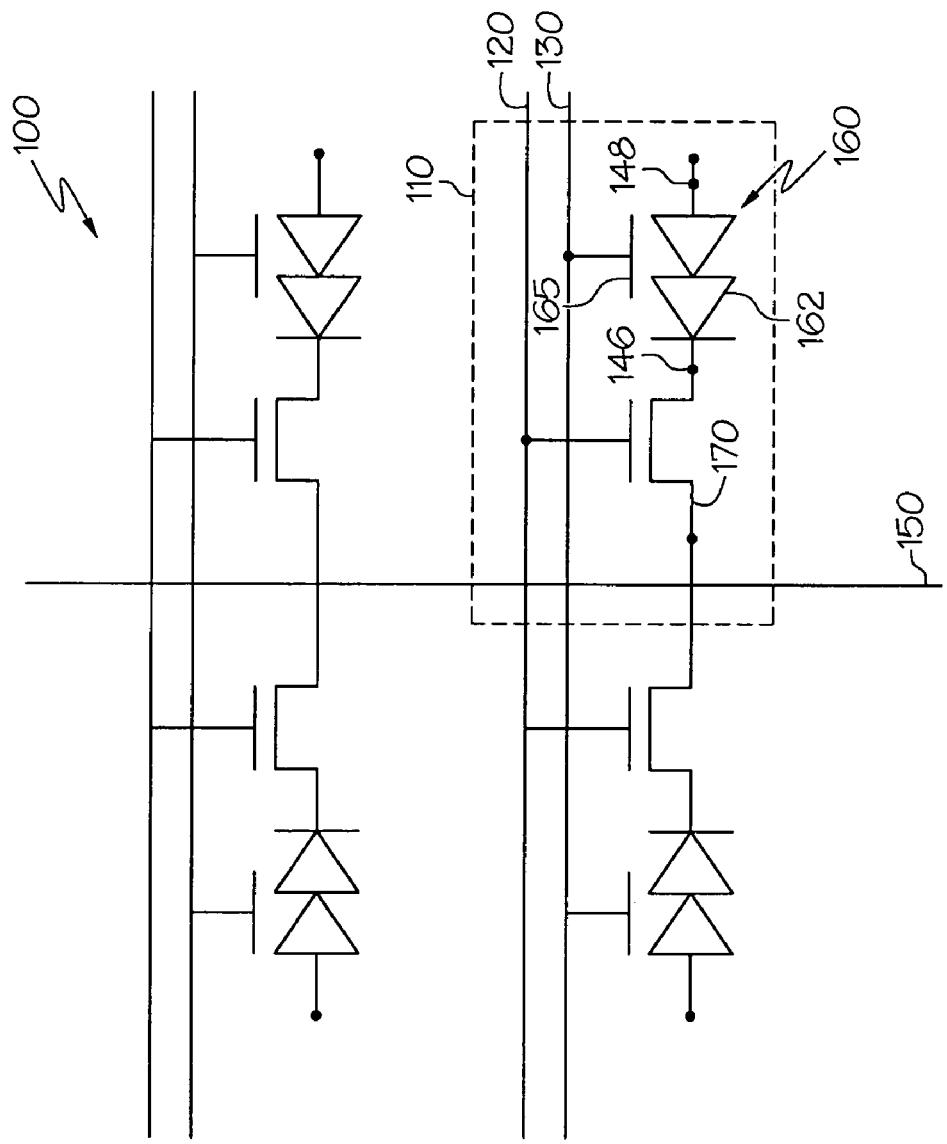
FIG. 1 is a circuit schematic which illustrates an array of conventional thyristor-based Random Access Memory (T-RAM) cells.
Figure 2:
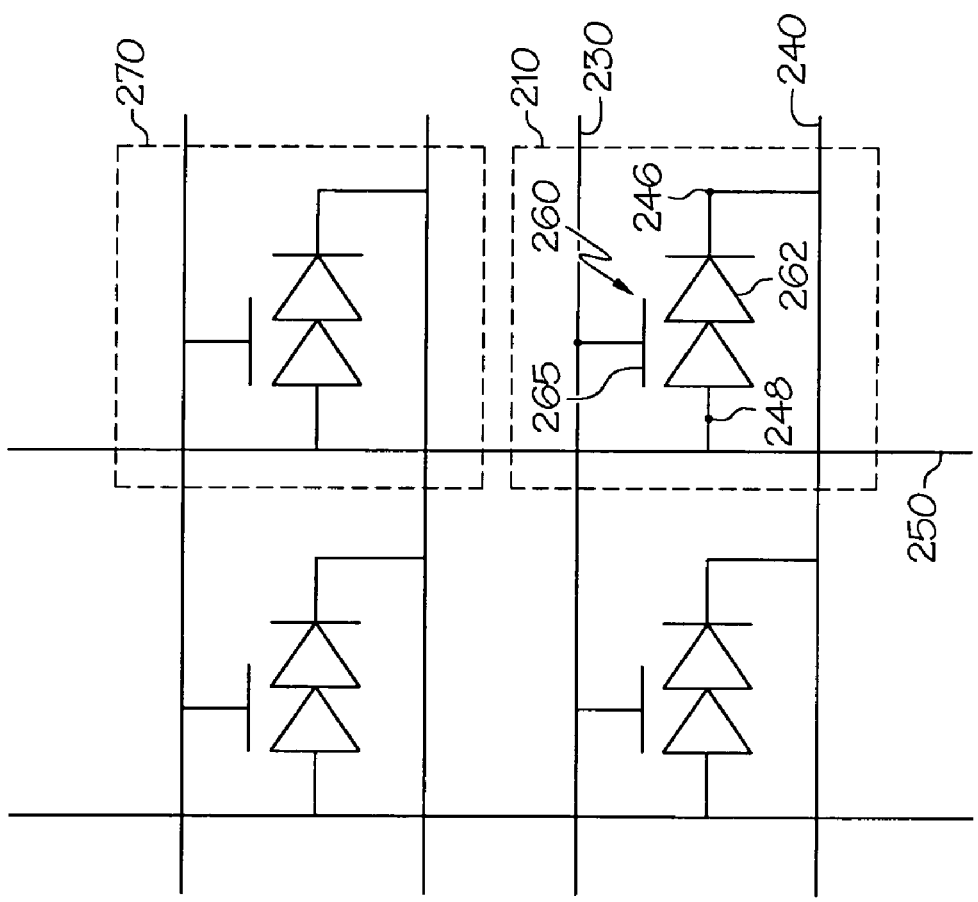
FIG. 2 is a circuit schematic which illustrates an array of conventional Thin Capacitively-Coupled Thyristor (TCCT)-DRAM cells.
Figure 3:
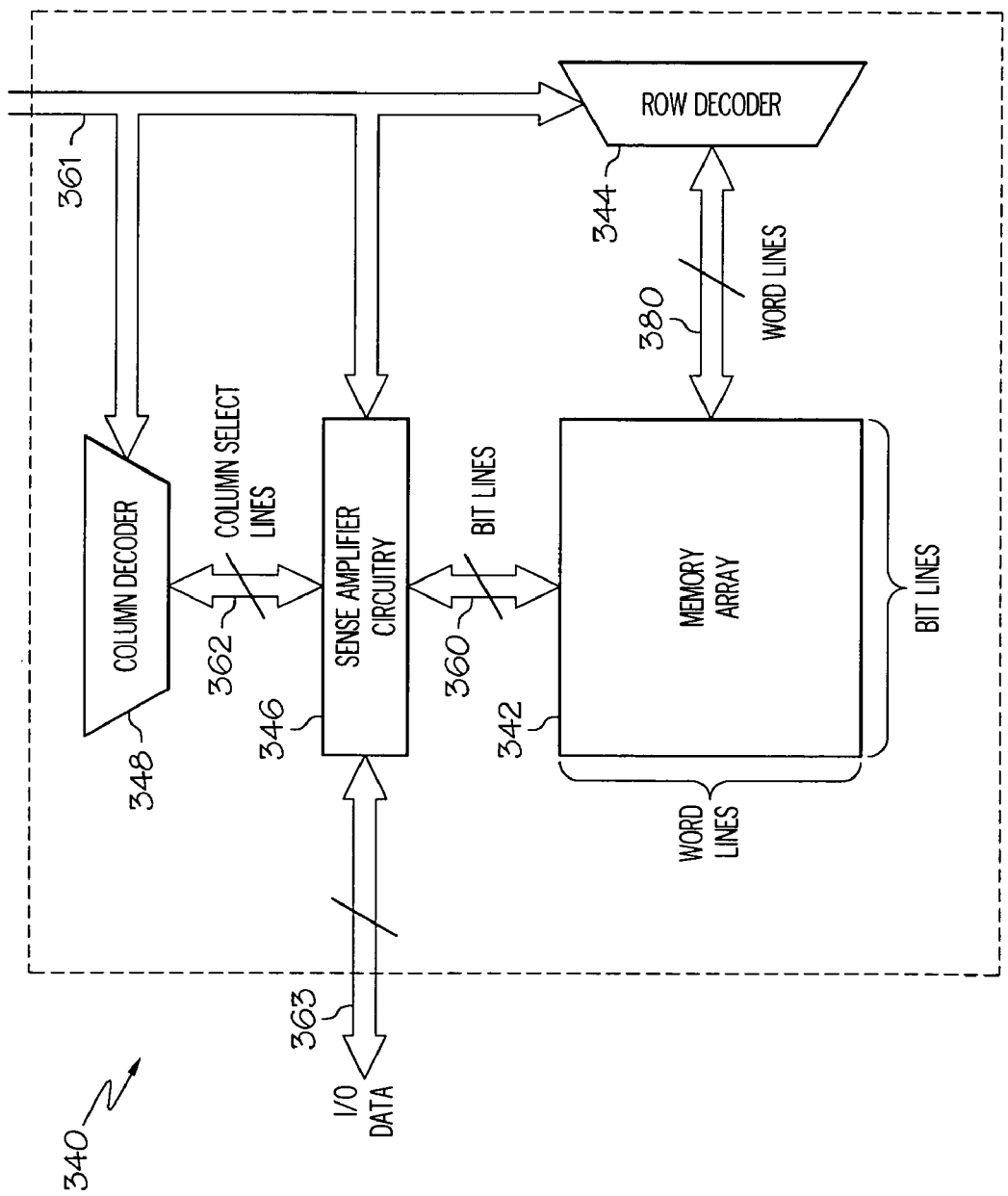
FIG. 3 is a block diagram of a memory system which can be used with embodiments of the present invention.

FIG. 3 is a block diagram of a memory system 340 which can be used with embodiments of the present invention. The memory system 340 is a simplified representation of an exemplary embodiment, and an actual system 340 may also include conventional elements, logic, components, and functionality not shown in FIG. 3. The memory system 340 can perform operations including write one (1), read one (1), write zero (0), and read zero (0)) with respect to a memory array 342.

The memory system 340 includes the memory array 342 which comprises a plurality of memory cells whose word lines and bit lines are commonly arranged into rows and columns, respectively, row and column decoders 344, 348 and sense amplifier circuitry 346. Each memory cell is designated with a row address and column address. For a particular memory cell, a particular word line controls access to its particular storage element by allowing or preventing the signal (representing a logic "0" or a logic "1") carried on a particular bit line to be written to or read from the storage element. Thus, each memory cell 100 can store one bit of data as a logical "0" or logical "1."

The bit lines of the memory array 342 can be connected to the sense amplifier circuit 346, while its word lines can be connected to the row decoder 344. Address and control signals are input on address/control lines 361 into the memory system 340. The address/control lines 316 are connected to the column decoder 348, sense amplifier circuit 346 and row decoder 344. The address/control lines 316 are used, among other things, to gain read and write access to the memory array 342.

The column decoder 348 is connected to the sense amplifier circuit 346 via control and column select signals on column select lines 362. The sense amplifier circuitry 346 receives input data destined for the memory array 342 and outputs data read from the memory array 342 over input/output (I/O) data lines 363. Data is read from the cells of the memory array 342 by activating a word line (via the row decoder 344), which couples all of the memory cells corresponding to that word line to respective bit lines 360, which define the columns of the array. One or more bit lines are also activated. When a particular word line and bit lines are activated, thereby selecting a bit or bits, the sense amplifier circuitry 346 connected to a bit line detects and amplifies the data in the selected bit by measuring the potential difference between the activated bit line and a reference line.

Figure 4:
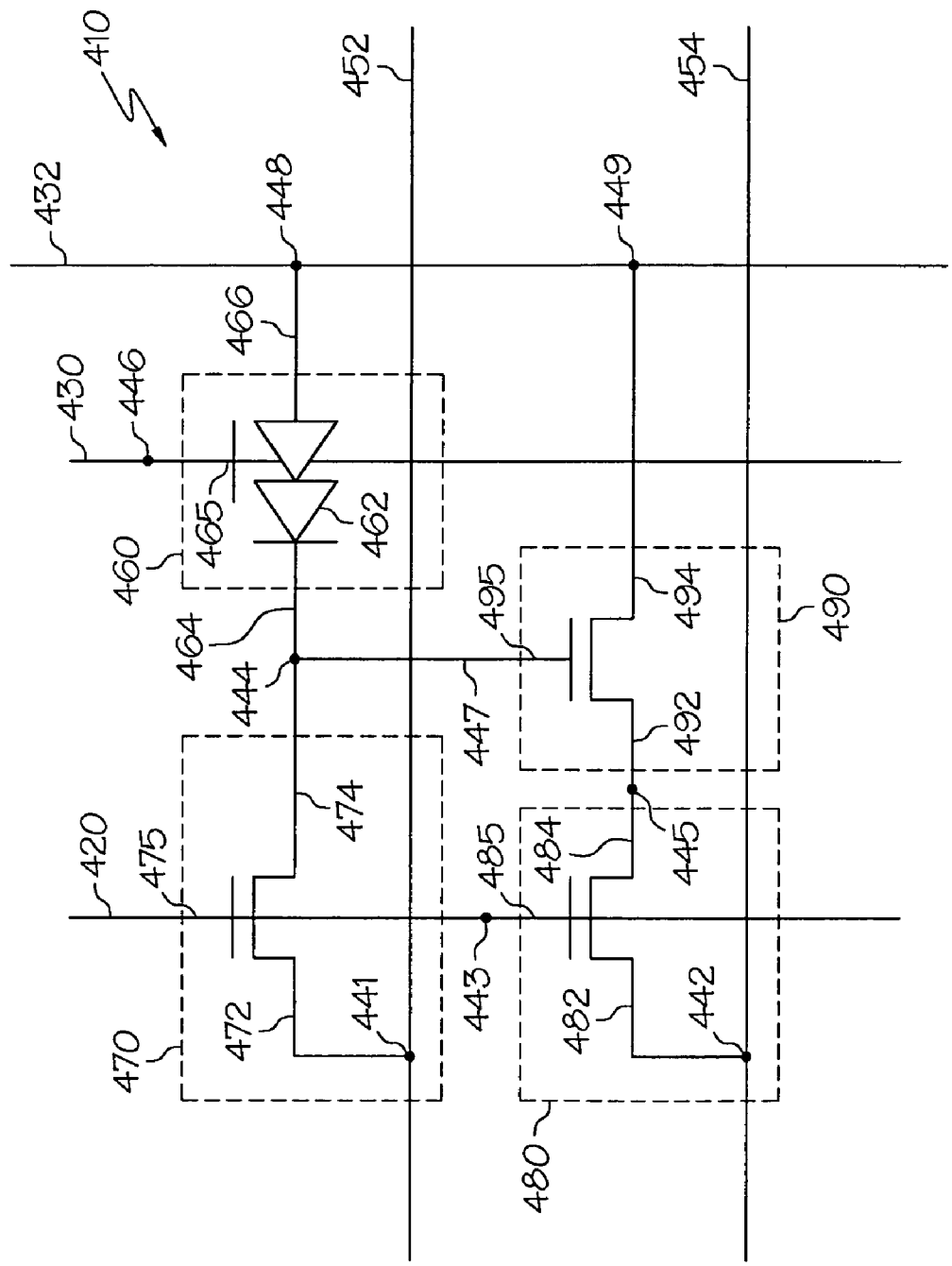
FIG. 4 is a circuit schematic which illustrates a memory cell in accordance with an embodiment of the present invention.
Figure 5:
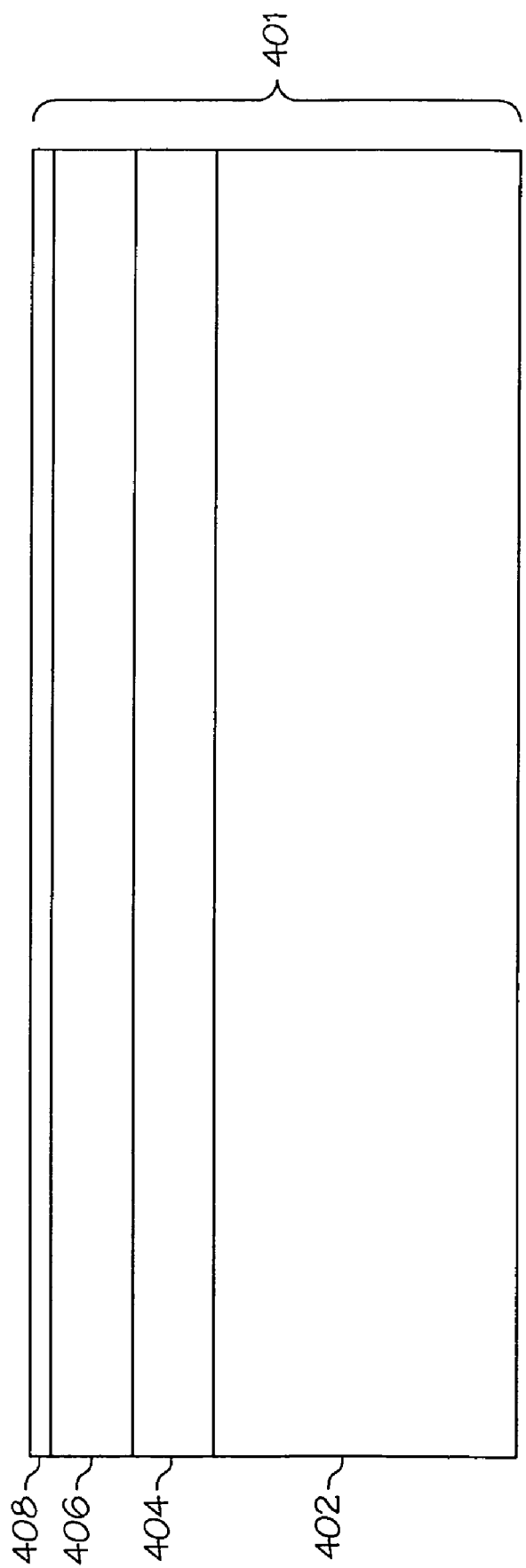
FIGS. 5, 7, 8, 10-11, 13-14, and 16-21 illustrate, in cross section, a memory cell of FIG. 4 and method steps for its fabrication in accordance with the various embodiments of the invention.

FIG. 4 is a circuit schematic which illustrates a memory cell 410 in accordance with an embodiment of the present invention. While a single memory cell 410 is illustrated in FIG. 4, it will be appreciated by those skilled in the art that in practical implementations, the memory cell 410 is likely to be one of a large number of memory cells that are interconnected in an integrated circuit. Those of skill in the art will understand that memory cell 410 is likely to be implemented in a memory cell array that can include thousands or more of such memory cells. In one embodiment, the memory cell 410 can be implemented as one of the memory cells within the memory array 342 of the memory system 340 illustrated in FIG. 3.

The memory cell 410 comprises a gated lateral thyristor (GLT) device 460, a write access transistor 470, a read access transistor 480 and a sensing transistor 490. A plurality of control lines are used to operate the memory cell 410 including a word line 420, a write enable line 430, a supply line 432, a write bit line 452, and a read bit line 454. In one implementation, the word line 420 comprises polysilicon, the write enable line 430 and the supply line 432 each comprise a first metal layer, and the write bit line 452 and the read bit line 454 each comprise a second metal layer.

In one implementation, each of the transistors 470, 480, 490 is a MOSFET and thus includes a source electrode, a drain electrode, and a gate electrode. Although the term "MOSFET" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate (whether silicon or other semiconductor material). The MOSFET transistors can be either NMOSFETs or PMOSFETs depending on the implementation. In FIG. 4, the write access transistor 470 which includes a source electrode 472, a drain electrode 474, and a gate electrode 475 that is coupled to the word line 420. The read access transistor 480 includes a source electrode 482, a drain electrode 484, and a gate electrode 485. The sensing transistor 490 includes a source electrode 492, a drain electrode 494, and a gate electrode 495.

The gated-lateral thyristor (GLT) device is represented by symbol 460 in FIG. 4. It is to be understood that the GLT device 460 comprises a thyristor 462 (represented as two diodes in series) and a Metal Oxide Silicon (MOS) capacitor connected to the thyristor 462, as illustrated, for instance, in FIG. 20. In general, the thyristor is a bi-stable, three terminal device which comprises a gated electrode 465, a cathode region 464, an anode region 466, and a pair of base regions (not shown) disposed between the anode region 466 and cathode region 464. Contacts are made to the anode region 466 to create an anode terminal, to the cathode region 464 to create a cathode terminal, and to the gated electrode 465 to create a gate terminal. PN or NP junctions are formed between the anode region 466 and one of the base regions, between the pair of base regions, and between the other one of the base regions and the cathode region 464. In GLT device 460 the MOS capacitor (not shown) is connected to one of the base regions (not shown) of the thyristor 462.

In one exemplary embodiment of the memory cell 410, which will be described below with respect to FIGS. 5-20, the transistors 470, 480, 490 are NMOSFETs, and the GLT device 460 comprises a PNPN thyristor 462 coupled to a MOS capacitor. As illustrated in FIG. 20, the PNPN thyristor 462 includes a gated electrode 465 (that serves as one plate of the MOS capacitor), a P-type anode region 466, an N-type base region 468, a P-type base region 463 and an N-type cathode region 464 arranged in a PNPN configuration, where the N-type and P-type base regions 468, 463 are laterally disposed between the P-type anode region 466 and N-type cathode region 464. As above, contacts are made to the P-type anode region 466, to the N-type cathode region 464, and to the gated electrode 465. A PN junction is formed between P-type anode region 466 and the N-type base region 468, another PN junction is formed between the N-type base region 468 and the P-type base region 463, and yet another PN junction is formed between the P-type base 463 and the N-type cathode region 464. The MOS capacitor of the GLT device 460 includes a gated electrode 465, the P-type base region, and a gate insulator layer disposed between the gated electrode 465 and the P-type base region. The gate insulator layer serves as the capacitor dielectric. The N-type base region and the P-type base region are adjacent one another. The MOS capacitor is connected to the P-base region of the thyristor. In an alternative exemplary embodiment, the transistors 470, 480, 490 are PMOSFETs, and the GLT device 460 comprises a thyristor coupled to a MOS capacitor, where the thyristor is arranged in an NPNP configuration, and the MOS capacitor is connected to an N-base.

FIG. 4 illustrates various nodes 441, 442, 443, 444, 445, 446, 448, 449 to help illustrate the electrical and/or physical couplings between different devices 460, 470, 480, 490 and the various control lines 420, 430, 432, 452, 454 that make up the memory cell 410. The various nodes do not necessarily imply that the different devices 460, 470, 480, 490 and control lines 420, 430, 432, 452, 454 that make up the memory cell 410 are directly connected to one another, and in some embodiments additional intervening devices (not illustrated) may be present between a particular device and a given node.

The cathode node 464 of the GLT device 460 is coupled to the drain electrode 474 of the write access transistor 470 and the gate electrode 495 of the read access transistor 480 at node 444. The gated electrode 465 of the GLT device 460 is coupled to the write enable line 430 at node 446, and the anode node 466 of the GLT device 460 is coupled to the supply line 432 at node 448.

The sensing transistor 490 is coupled to the supply line 432 at node 449, and coupled to the drain electrode 474 of write access transistor 470 and the cathode node 464 of the GLT device 460 at node 444. The source electrode 492 of the sensing transistor 490 is coupled to the drain electrode 484 of the read access transistor 480 at node 445. The sensing transistor 490 senses the voltage at node 444. For example, if the GLT device 460 stores a logical one (1), the voltage level at node 444 will be "high" (e.g., greater than 0.5 volts) and large enough to turn on the sensing transistor 490, and the sensing transistor 490 induces a voltage change on read bit line 454. If the GLT device 460 stores a logical zero (0), the voltage level at node 444 will be approximately 0.0 volts and the sensing transistor 490 does not induce a voltage change on read bit line 454 as the sensing transistor 490 will remain off.

In the schematic of FIG. 4, the write access transistor 470 and the read access transistor 480 are illustrated as being coupled to the word line 420, and the gate electrode 485 of read access transistor 480 is illustrated as being coupled to the gate electrode 475 of write access transistor 470 at node 443. Even though gate electrodes 475, 485 are illustrated as being coupled at node 443, it will be appreciated by those skilled in the art that the gate electrodes 475, 485 are actually portions of word line 420 and formed from a common layer of conductive material, such as polysilicon.

In the embodiment illustrated in FIG. 4, the source electrode 472 of the write access transistor 470 is coupled to the write bit line 452 at node 441, the source electrode 482 of the read access transistor 480 is coupled to the read bit line 454 at node 442, and the drain electrode 494 of the sensing transistor 490 is coupled to the supply line 432 at node 449. The write access transistor 470 controls write access during a write operation via write bit line 452 by switching only when the write bit line 452 is not in standby mode. The standby mode refers to a holding state between read and write operations during which word line 420 is at a holding voltage. The read access transistor 480 controls read access during a read operation via read bit line 454. By providing separate write and read bit lines 452, 454 along with a separate write access transistor 470 and a separate read access transistor 480, the reading and writing operations are completely isolated from each other since the read and write paths are decoupled from one another thereby eliminating the read disturbance issues mentioned above. Operation of the memory cell 410 will be described in greater detail below with reference to FIG. 23 following a description of method steps used to fabricate the memory cell 410.

FIGS. 5-22 illustrate a memory cell 410 and method steps for its fabrication in accordance with various embodiments of the invention. In particular, FIGS. 6, 9, 12, 15, 22 illustrate top plan views of the memory cell 410 and method steps for its fabrication, whereas FIGS. 5, 7, 8, 10-11, 13-14, and 16-21 illustrate cross sectional views of the memory cell 410 and method steps for its fabrication. The plan views illustrated in FIGS. 6, 9, 12, 15, 22 include upper and lower section lines. FIGS. 7, 11, 13, 16, 18, and 20 illustrate cross sectional views of the memory cell 410 taken across the upper section line, whereas FIGS. 8, 10, 14, 17, 19, and 21 illustrate cross sectional views of the memory cell 410 taken across the lower section line.

In the illustrative embodiments which are described below, the exemplary memory cell 410 comprises three N-channel MOS (NMOS) transistors 470, 480, 490 and a GLT device 460 which comprises a PNPN thyristor coupled to a MOS capacitor. However, as will be explained below, similar method steps can be used to manufacture another memory cell comprising three P-channel MOS (PMOS) transistors and a GLT device which comprises a NPNP thyristor coupled to a MOS capacitor.

Various steps in the manufacture of memory cells, MOS transistors and thyristors are well known and so, in the interest of brevity, many conventional steps will only be mentioned briefly herein or will be omitted entirely without providing the well known process details. As noted above, as used herein, the term "MOS transistor" is to be interpreted non-restrictively and refers to any semiconductor device that includes a conductive gate electrode that is positioned over a gate insulator which, in turn, is positioned over a semiconductor substrate.

The initial steps in the fabrication of memory cell 410 are conventional so the initial steps themselves are not shown and will not be described in detail. The manufacture begins with providing a semiconductor structure or substrate 401 in and on which a memory cell 410 is fabricated. The semiconductor substrate 401 can be either a bulk semiconductor material or a semiconductor-on-insulator (SOI) substrate. In accordance with an embodiment of the invention illustrated in FIG. 5, the semiconductor substrate 401 is illustrated as a (SOI) structure 401 which comprises at least one thin layer of semiconductor material 406 disposed on or over a buried oxide insulating layer 404 which, in turn, is supported by a carrier wafer or substrate 402 so that the buried oxide insulating layer 404 is disposed between the carrier wafer 402 and the semiconductor layer 406. Those of skill in the semiconductor art will appreciate that the semiconductor layer 406 can be a silicon layer, a germanium layer, a gallium arsenide layer, or other semiconductor materials. In one embodiment, the semiconductor layer 406 comprises a thin monocrystalline layer of silicon on the buried oxide insulating layer 404. The thin monocrystalline layer of silicon can be a silicon substrate having a (100) surface crystal orientation. The thin silicon layer preferably has a resistivity of at least about 1-35 Ohms per square. As used herein, the term "silicon layer" will be used to encompass the relatively pure silicon materials or lightly impurity-doped monocrystalline silicon materials typically used in the semiconductor industry as well as silicon admixed with small amounts of other elements such as germanium, carbon, and the like, as well as impurity dopant elements such as boron, phosphorus, and arsenic, to form a substantially monocrystalline semiconductor material. In one embodiment, the buried oxide insulating layer 404 can be, for example, a silicon dioxide layer, which preferably has a thickness of about 40-200 nm.

The semiconductor layer 406 can be impurity doped either with N-type conductivity determining impurities or P-type conductivity determining impurities depending on the conductivity type of the GLT device 460 and MOS transistors 470, 480, 490 to be formed. In an NMOS embodiment, the semiconductor layer 406 is doped with P-type conductivity determining impurities to create P-well regions 463, 471, 486, 493 in the semiconductor layer 406. Impurity doping can take place, for example, by the implantation and subsequent thermal annealing of dopant ions such as boron. Alternatively, in a PMOS embodiment, the semiconductor layer 406 can be doped with N-type conductivity determining impurities to create N-well regions (not shown) in the semiconductor layer 406. Impurity doping can take place, for example, by the implantation and subsequent thermal annealing of dopant ions such as phosphorus and arsenic.

Once the P-well regions 463, 471, 486, 493 are formed, trenches can be etched into the semiconductor layer 406 for the formation of dielectric isolation regions (not shown) between adjacent memory cells. For example, the memory cell 410 can be electrically isolated from other memory cells (not shown) by a dielectric isolation region (not shown), preferably a shallow trench isolation (STI) region. As is well known, there are many processes that can be used to form the STI, so the process need not be described here in detail. In general, STI includes a shallow trench that is etched into the surface of the semiconductor layer 406 that is subsequently filled with an insulating material. After the trench is filled with an insulating material, such as an oxide, the surface is usually planarized, for example, by chemical mechanical planarization (CMP).

Figure 6:
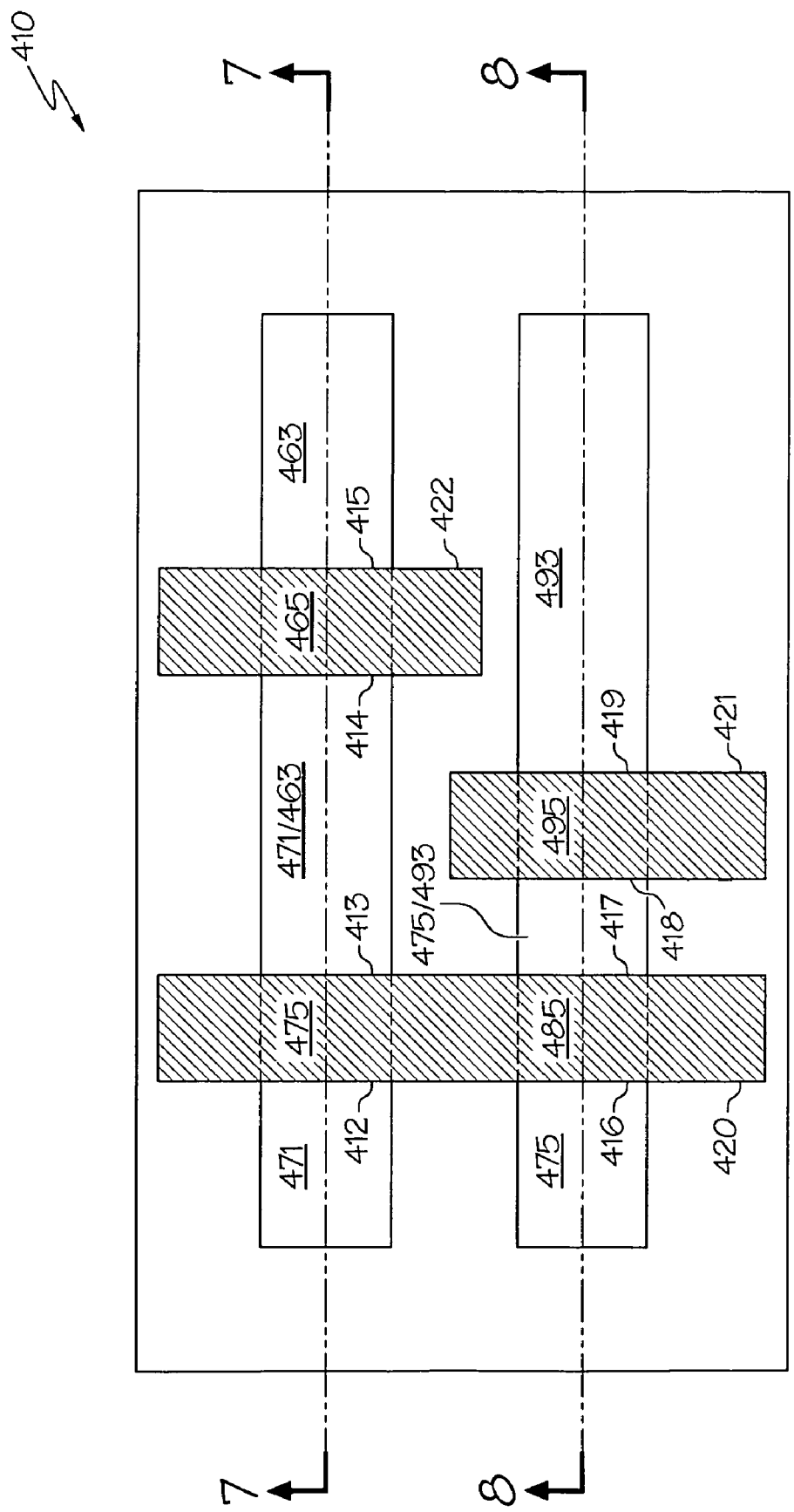
FIGS. 6, 9, 12, 15, and 22 illustrate, in top plan view, the memory cell of FIG. 4 and method steps for its fabrication in accordance with various embodiments of the invention.
Figure 7:
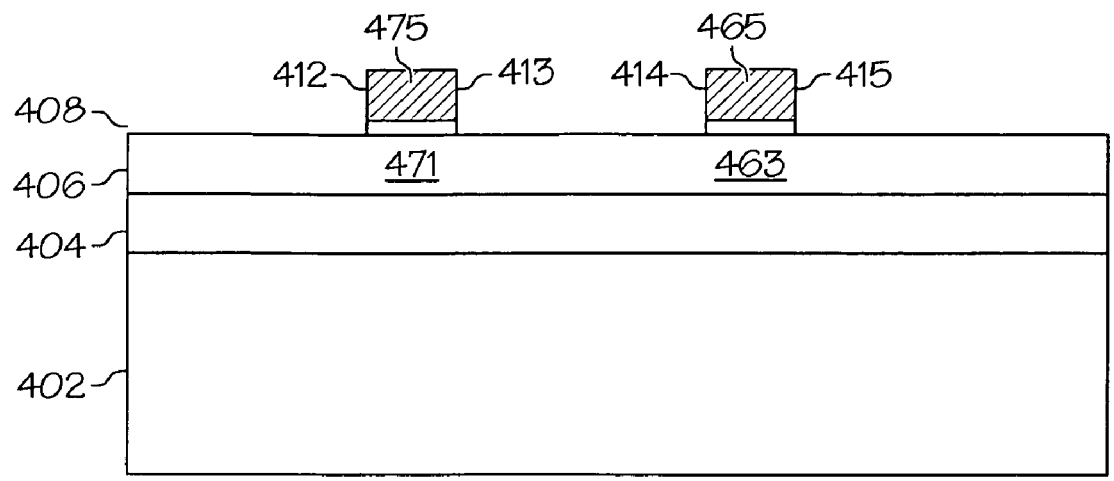
Figure 8:
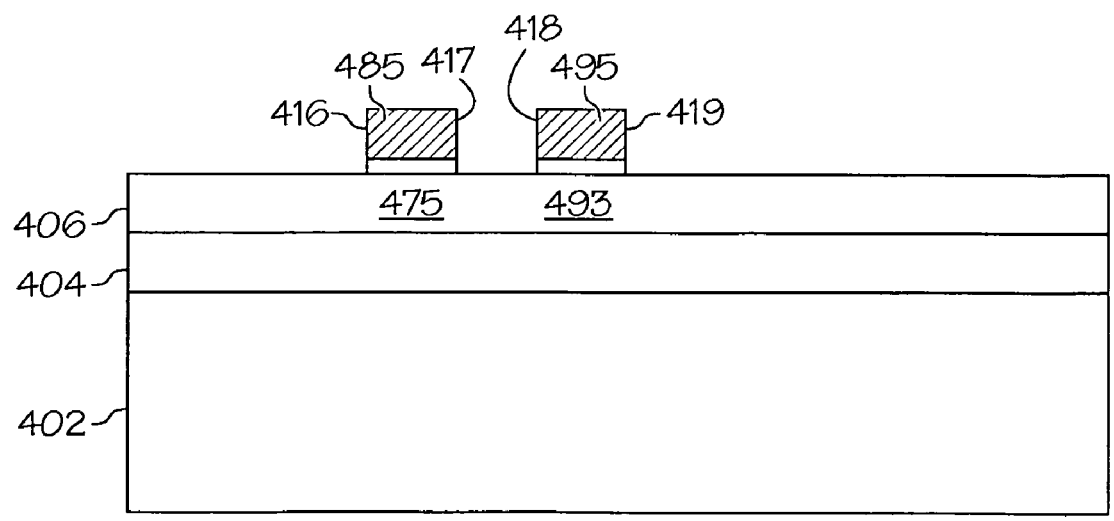

As illustrated in FIGS. 6-8, a layer of gate insulating material 408 is formed over the semiconductor layer 406 and gate electrodes 465, 475, 485, 495 are formed overlying the gate insulating material 408 and impurity-doped P-well regions 463, 471, 486, 493, respectively. The layer of gate insulating material 408 can be a layer of thermally grown silicon dioxide or, alternatively, a deposited insulator such as silicon oxide, silicon nitride, or a high dielectric constant ($\kappa$) insulator material having a high dielectric constant ($\kappa$) relative to silicon dioxide. Examples of "high-$\kappa$ dielectric" materials include hafnium and zirconium silicates, and their oxides, including, but not limited to, hafnium oxide ($HfO_2$), hafnium silicate (HfSiO), or the like. Deposited insulators can be deposited, for example, by chemical vapor deposition (CVD), low pressure chemical vapor deposition (LPCVD), plasma enhanced chemical vapor deposition (PECVD) or atomic layer deposition (ALD). The gate insulator layer 408 preferably has a thickness of about 1-10 nm, although the actual thickness can be determined based on the circuit being implemented.

Gate electrodes 465, 475, 485, 495 are preferably formed by depositing a layer (not illustrated) of gate forming material overlying the layer of gate insulating material 408, and then patterning and etching the layer of gate forming material (as well as the underlying layer of gate insulating material 408) to form strips 420, 421, 422 of gate forming material that overlie remaining portions of the gate insulating material 408 as illustrated in FIG. 6. The layer of gate forming material, and hence the gate electrodes 465, 475, 485, 495, can be formed from a layer of polycrystalline silicon or other conductive materials such as metals. In one embodiment, the layer of gate forming material comprises a layer of undoped polycrystalline silicon having a thickness of about 100-300 nm. The polycrystalline silicon can be deposited, for example, by the reduction of silane ($SiH_4$) in a CVD reaction such as a low pressure chemical vapor deposition (LPCVD).

Figure 9:
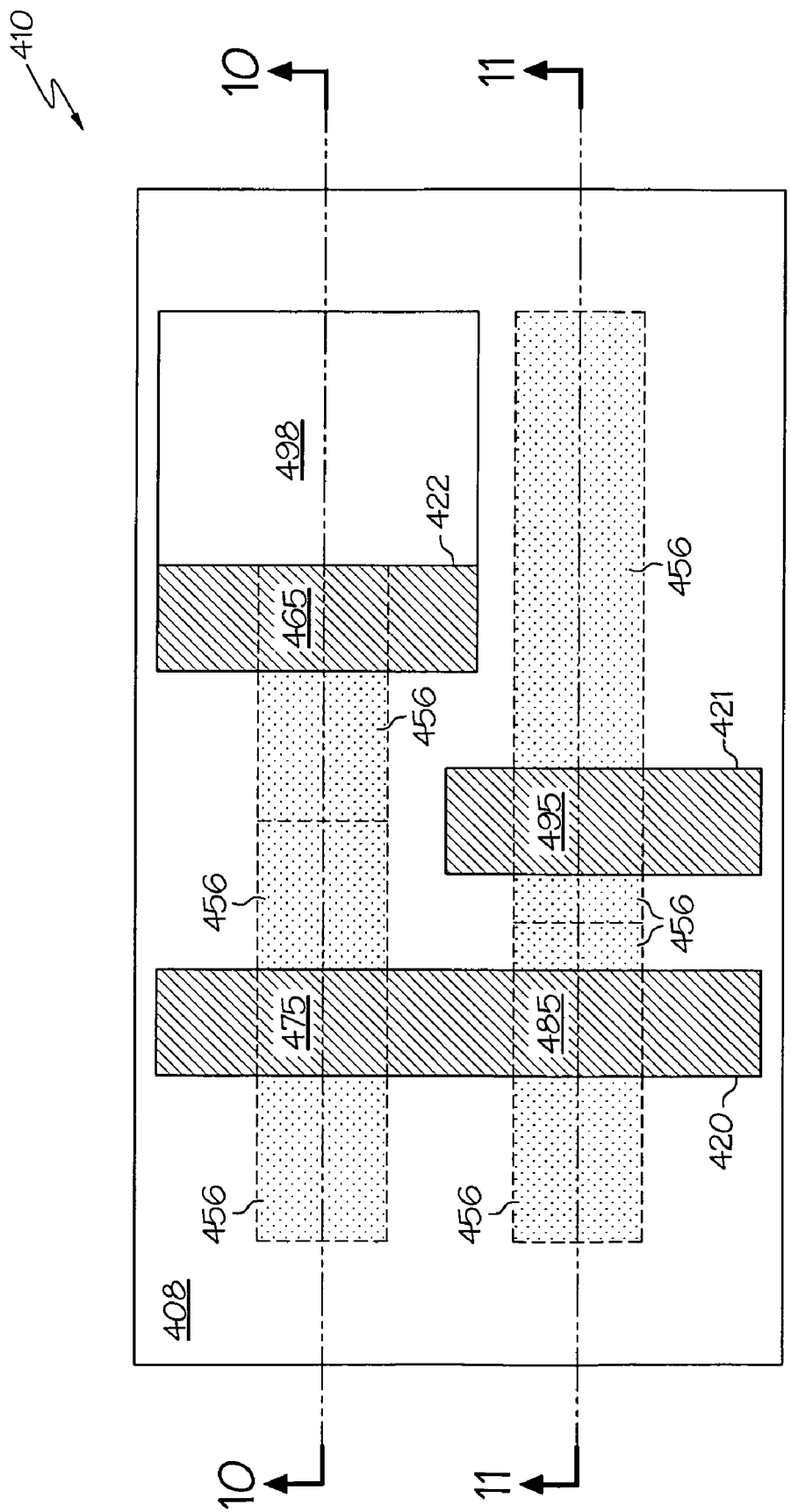
Figure 10:
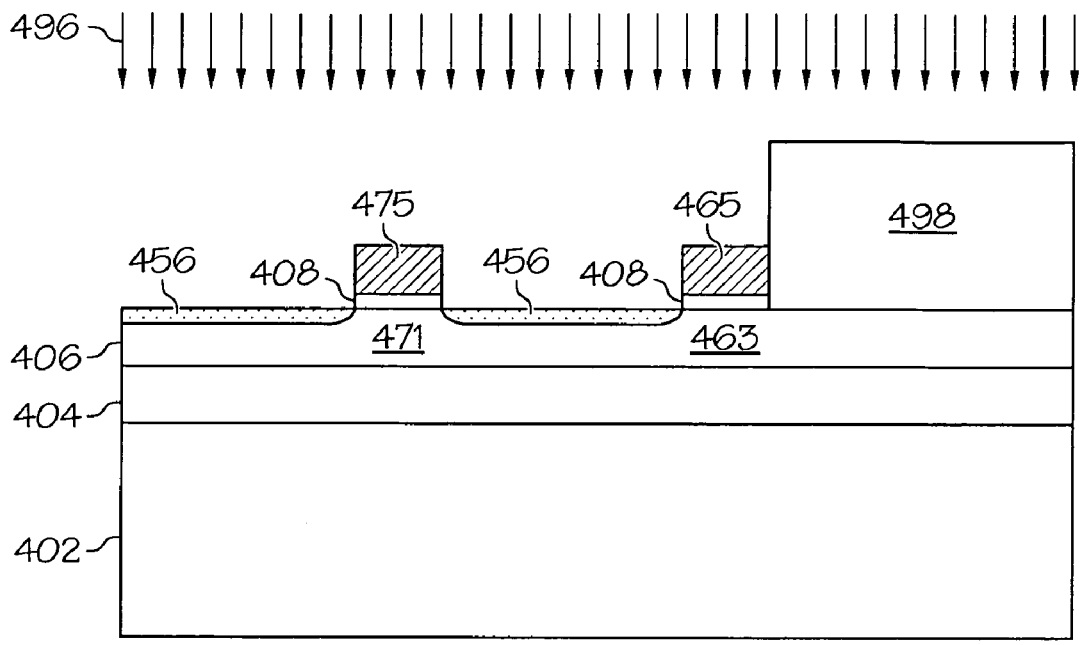
Figure 11:
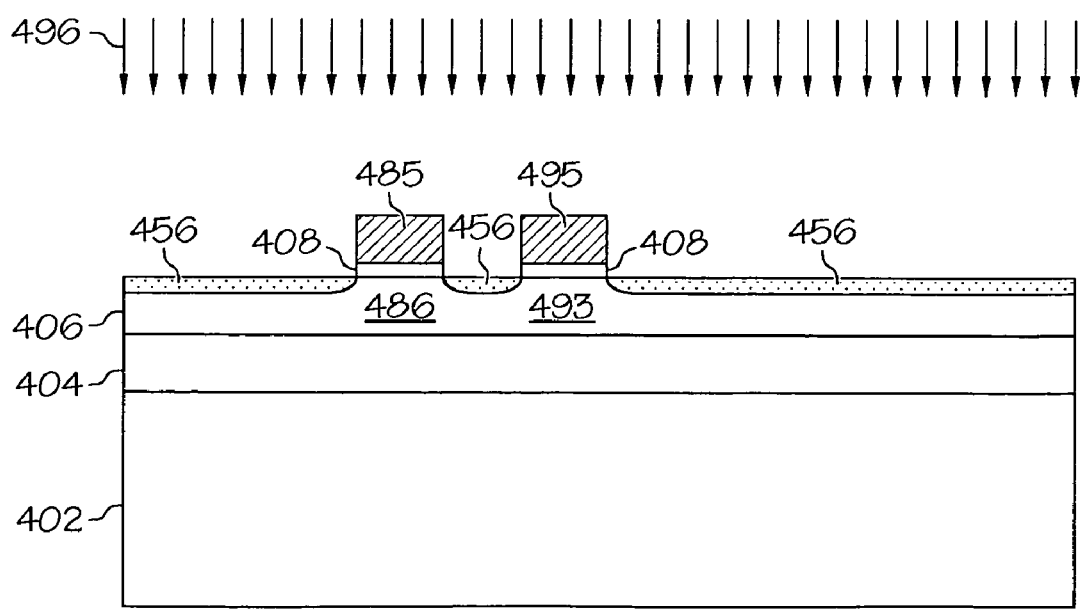

After patterning and etching the layer of gate forming material and the layer of gate insulating material 408 the gate electrodes 465, 475, 485, 495 have been formed, which overlies remaining portions of the gate insulating material 408. As illustrated in FIGS. 9-11, openings in the gate insulating material 408 expose portions of the P-well regions 463, 471, 486, 493 adjacent the gate electrodes 465, 475, 485, 495, and a mask layer 498 is formed overlying a portion of the P-well region 463. At least a surface portion of the exposed portions of P-well regions 463, 471, 486, 493 can be impurity doped with N-type conductivity determining impurities to create lightly doped extension regions 456 in the semiconductor layer 406 adjacent the gate electrodes 465, 475, 485, 495. Impurity doping can take place, for example, by the implantation and subsequent thermal annealing of dopant ions such as arsenic.

Figure 12:
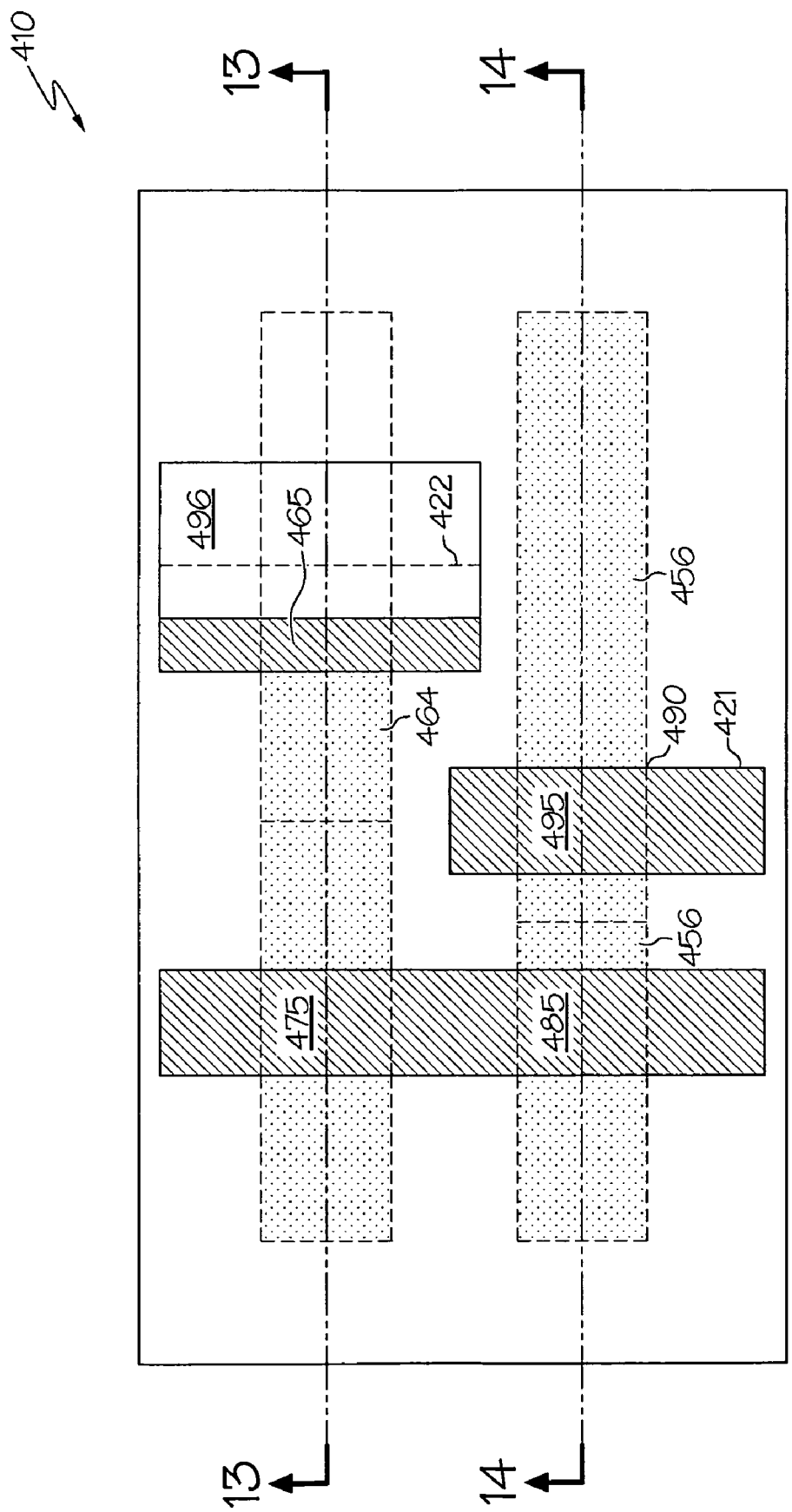
Figure 13:
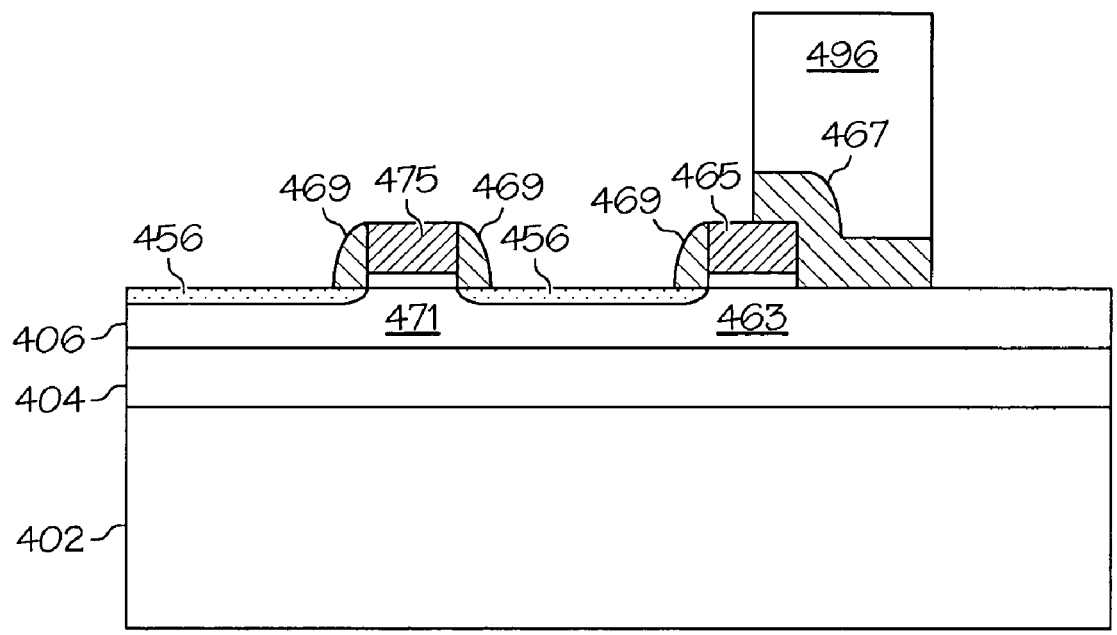
Figure 14:
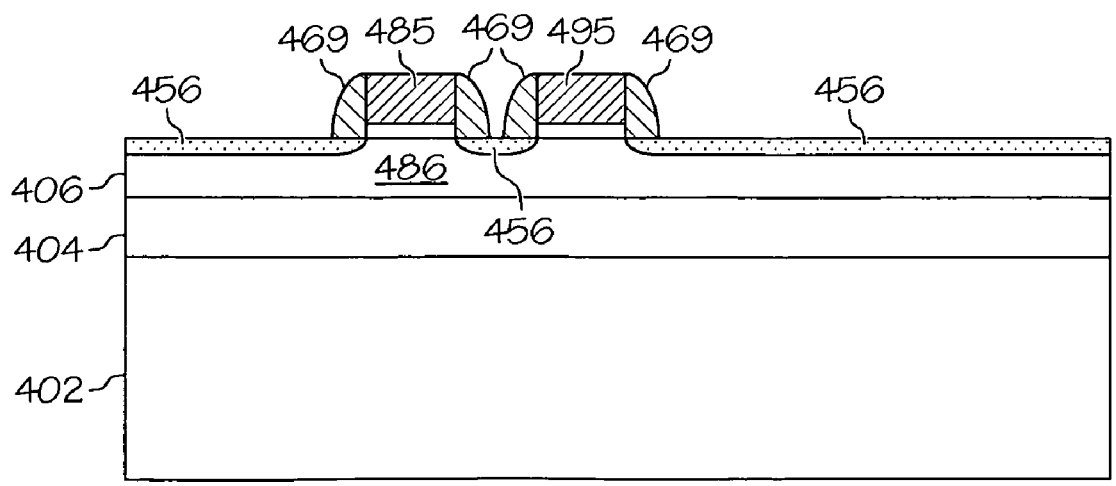

As illustrated in FIGS. 12-14, sidewall spacers 469 and insulating spacer block 467 are then formed. In one embodiment, a blanket layer of insulating material (not illustrated), such as a dielectric layer of silicon oxide and/or silicon nitride, is conformally deposited overlying the gate electrodes 465, 475, 485, 495 and exposed portions of the semiconductor layer 406 including the lightly doped extension regions 456. A layer of photosensitive material, such as photoresist, is then applied over the blanket layer of insulating material, and is patterned to leave a remaining portion 496 and to expose other portions of the blanket insulating layer. The exposed portions of the blanket insulating layer (i.e., those not covered by remaining photosensitive material 496) are then anisotropically etched with etchants, for example, by reactive ion etching (RIE), to form sidewall spacers 469 on sidewalls 412, 413, 414, 416, 417, 418, 419 of the gate electrodes 465, 475, 485, 495 and to form an insulating spacer block 467 on sidewall 415 of gate electrode 465. Silicon oxide and silicon nitride can be etched, for example, in a $CHF_3$, $CF_4$, or $SF_6$ chemistry. The insulating spacer block 467 overlies a portion of the semiconductor layer 406, a portion of gate electrode 465, and a sidewall 415 of gate electrode 465. The remaining portions of the photosensitive material 496 are then removed.

Figure 15:
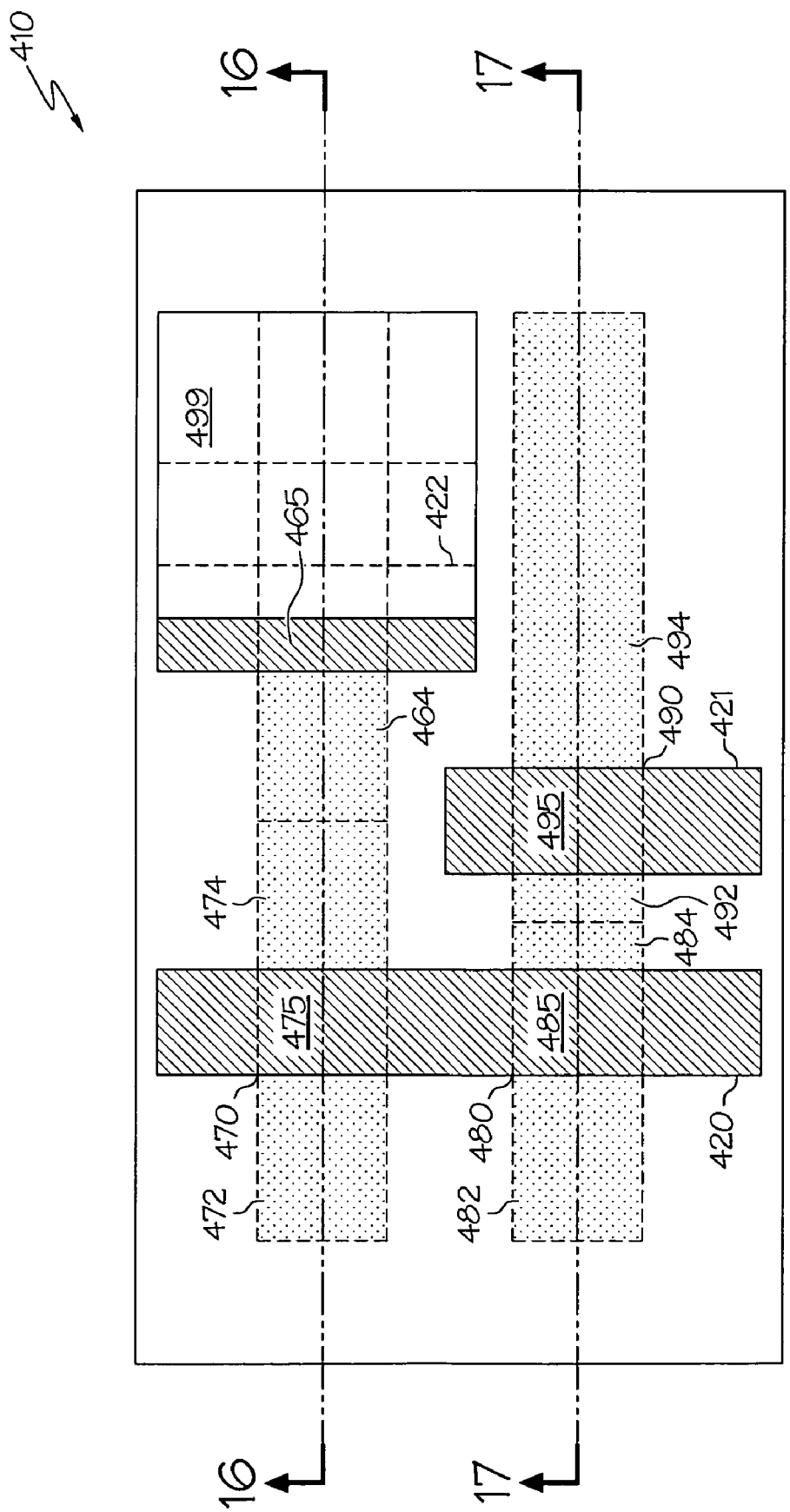
Figure 16:
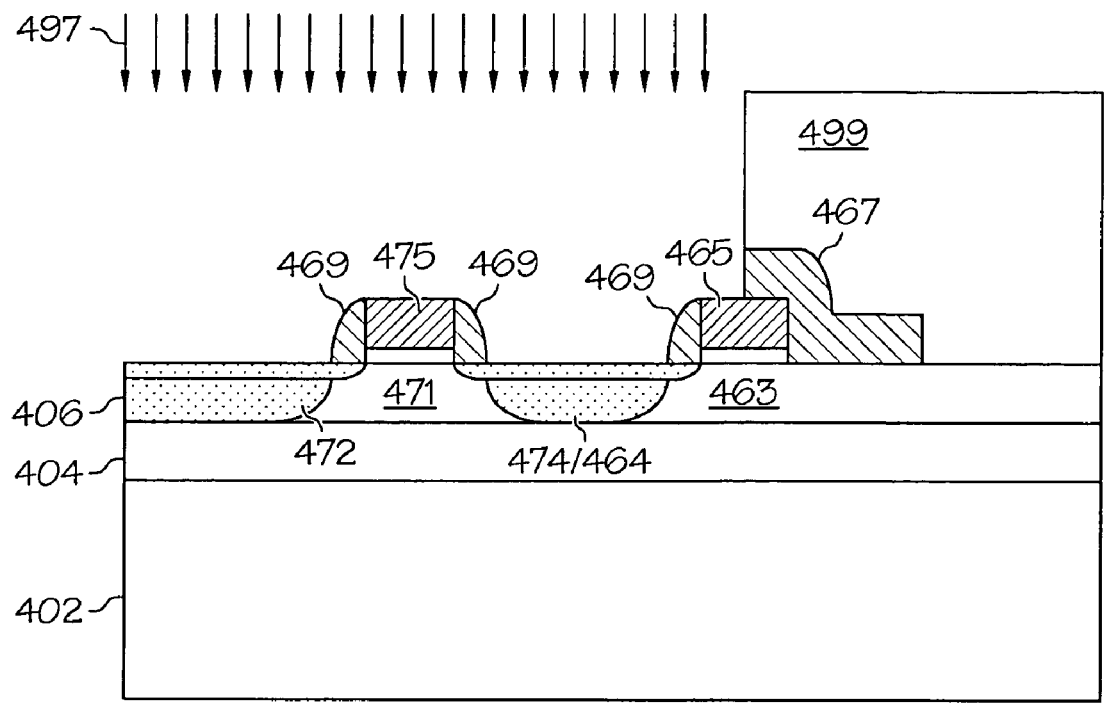
Figure 17:
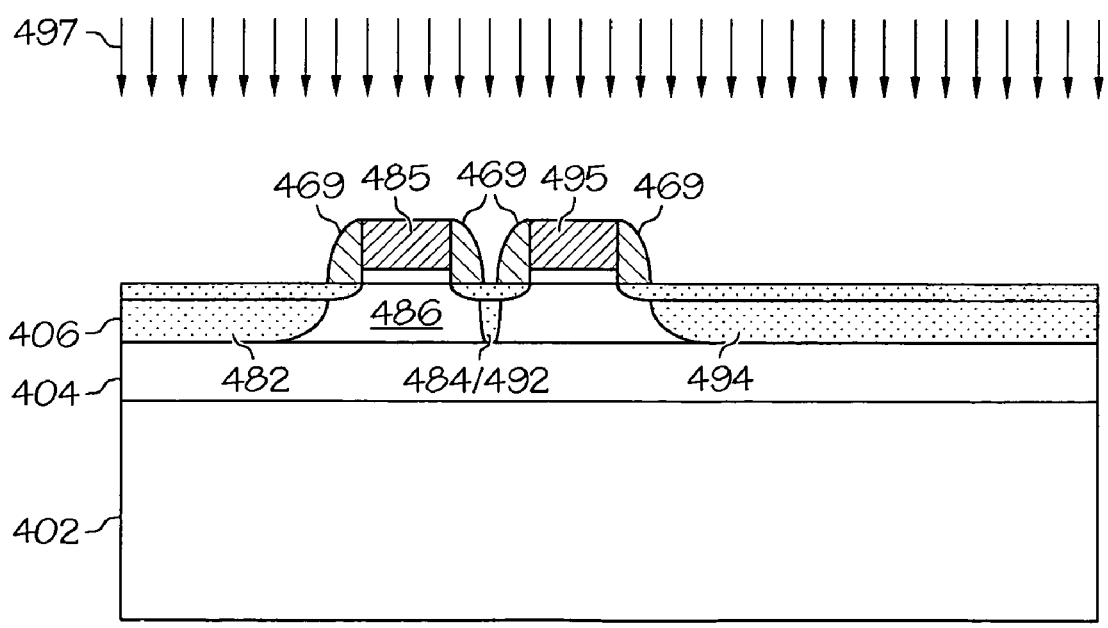

As illustrated in FIGS. 15-17, another layer of masking material, which can be, for example, a layer of photoresist, is then applied and patterned to provide an ion implant mask 499. The ion implant mask 499 covers regions of the semiconductor layer 406 which correspond to the eventual locations of the N-type base region/anode region 468, 466, and exposes regions of the semiconductor layer 406 which correspond to the eventual locations of a source region 472, a common drain/cathode region 474, 464, a source region 482, a common drain/source region 484, 492, and drain region 494. The source region 472, drain/cathode region 474, 464, source region 482, common drain/source region 484, 492, and drain region 494 are implanted at approximately zero degrees as represented by the arrows 497. In this exemplary embodiment, N-type conductivity determining ions, such as phosphorus or arsenic, are implanted. The layer of masking material 499 is then removed.

Figure 18:
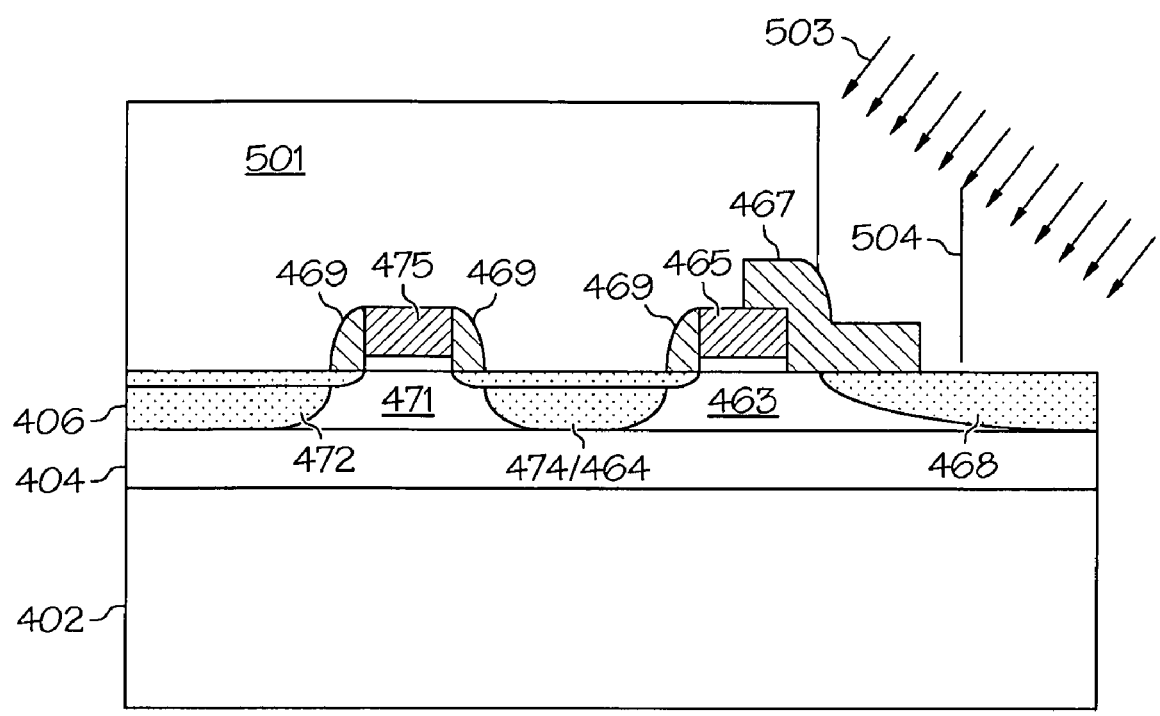
Figure 19:
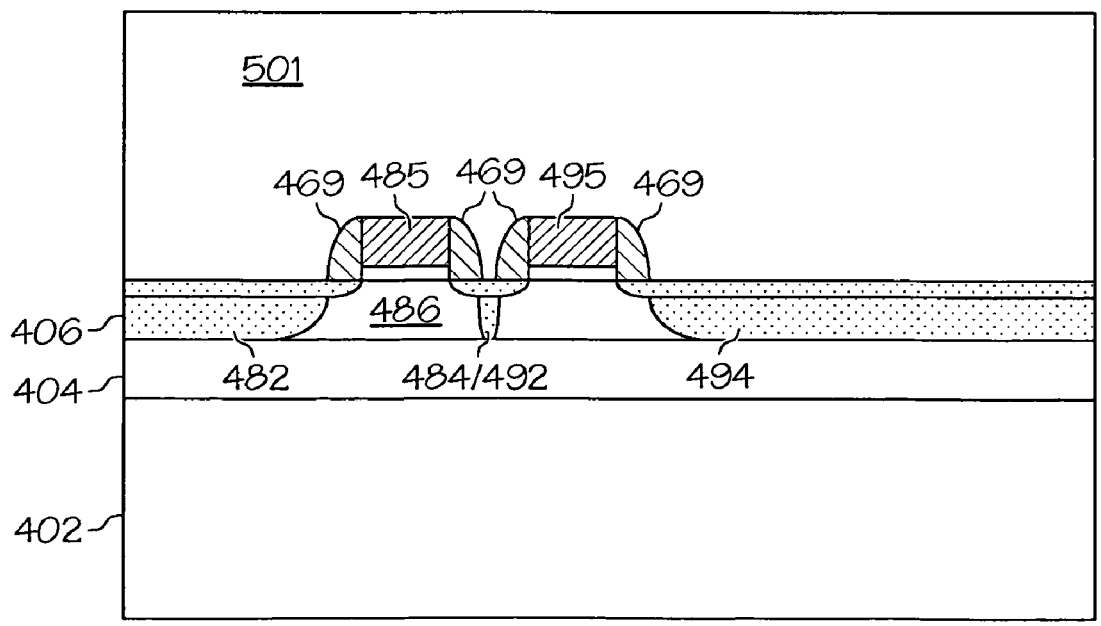
Figure 20:
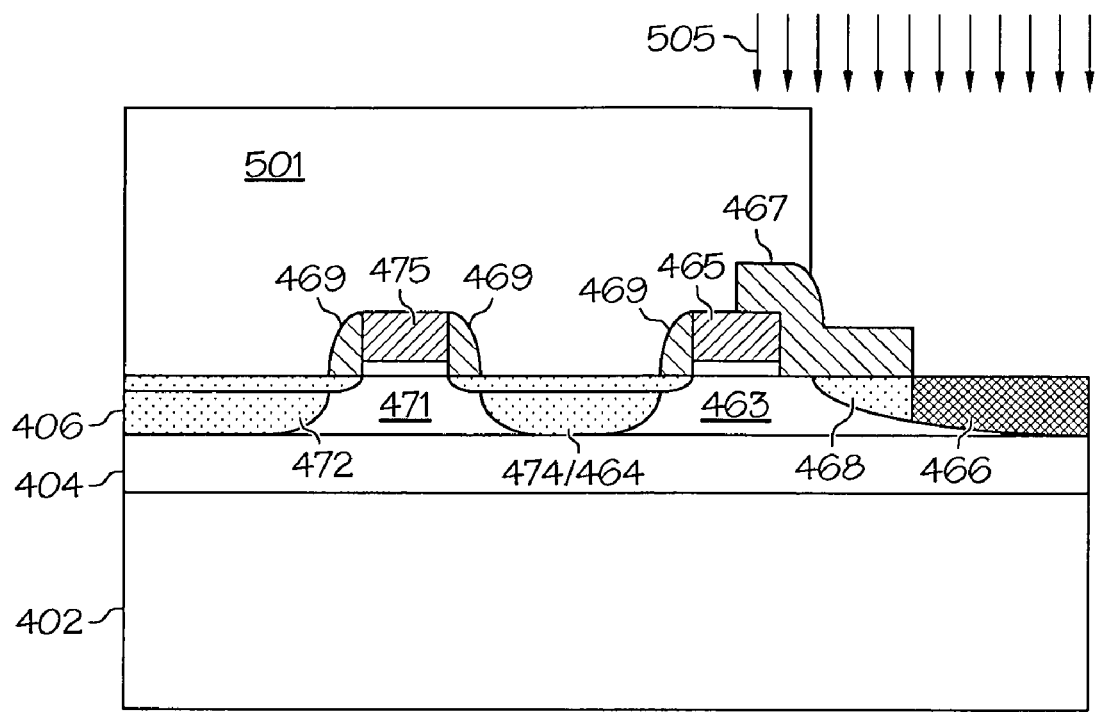
Figure 21:
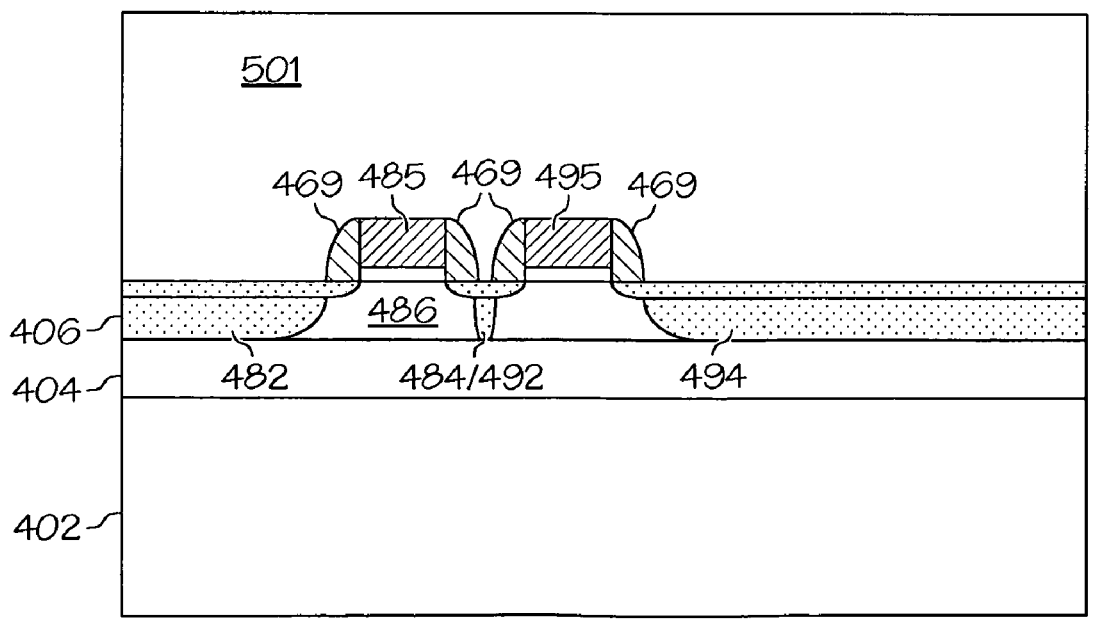

As illustrated in FIGS. 15, 18 and 19, a layer of masking material 501, which can be, for example, a layer of photoresist, is then applied over the gate electrodes 465, 475, 485, 495, and patterned to provide an ion implant mask which exposes regions of the semiconductor layer 406 which correspond to the eventual locations of an N-base region 468 and an anode region 466. The N-base region 468 is implanted at an angle with respect to a line 504 that is perpendicular to an upper surface of the semiconductor layer 406, as represented by the arrows 503 to create the N-base region 468 which extends under the insulating spacer block 467. The N-base region 468 is preferably implanted at an angle that is greater than zero (0) degrees and less than or equal to forty-five (45) degrees with respect to a line 504 that is perpendicular to an upper surface of the semiconductor layer 406. In this exemplary embodiment, N-type conductivity determining ions, such as phosphorus or arsenic, are implanted. Next, as illustrated in FIGS. 15, 20 and 21, the anode region 466 is implanted at approximately zero degrees as represented by the arrows 505 with P-type conductivity determining ions, such as boron, using a high-energy ion beam to form P-type anode region 466 of the GLT device 420. In an alternate embodiment, N-type conductivity determining ions, such as phosphorus or arsenic, are implanted. Formation of the P-type anode region 466 splits the N-type base region/anode region 468, 466 into two portions: an N-type base region 468 and a P-type anode region 466 of the GLT device 420. The N-type base region 468 is disposed between the P-well region 463 and the P-type anode region 466.

The layer of masking material 501 is then removed, and the resultant memory cell 410 structure is subjected to a rapid thermal anneal (RTA) process by exposing the memory cell 410 to controlled periods of high temperature. The RTA step electrically activates the ions in the N-type source region 472, the N-type drain/cathode region 474, 464, the N-type base region 468, the P-type anode region 466, the N-type source region 482, the N-type common drain/source region 484, 492, and the N-type drain region 494 and causes outward lateral diffusion (not illustrated) of dopant ions implanted in those regions. In addition, although not illustrated, silicide regions (not illustrated) can then be formed on the surface of exposed regions of the gate electrodes 465, 475, 485, 495, the N-type source region 472, the N-type drain/cathode region 474, 464, the N-type base region 468, the P-type anode region 466, the N-type source region 482, the N-type common drain/source region 484, 492, and the N-type drain region 494. The silicide regions provide a mechanism for electrically coupling contacts to these regions. In addition, the N-type drain/cathode region 474, 464 can be electrically coupled to the gate electrode 495 via a silicide region 444, as illustrated in FIG. 22.

Figure 22:
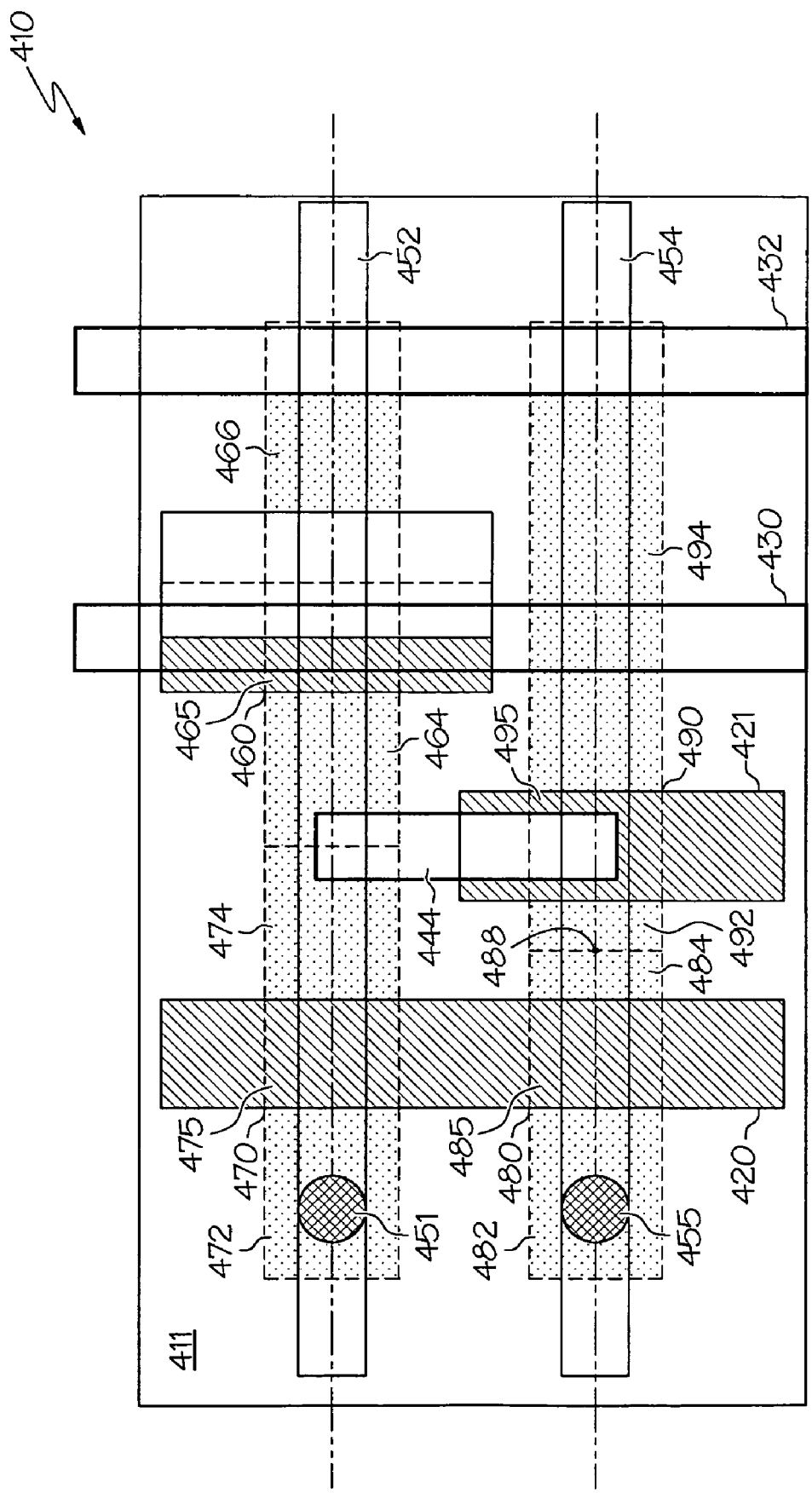

As illustrated in FIG. 22, the memory cell 410 can be completed by well-known steps (not illustrated) such as depositing a layer of dielectric material, etching openings through the dielectric material, and forming metallization that extends through the openings to electrically contact the various devices. For example, insulating material can be deposited overlying the gate electrodes 465, 475, 485, 495 and the exposed portions of the semiconductor layer 406 including the N-type source region 472, the N-type drain/cathode region 474, 464, the P-type anode region 466, the N-type source region 482, the N-type common drain/source region 484, 492, and the N-type drain region 494, and etched to form contact holes or openings that extend through the insulating material to the N-type source region 472, the P-type anode region 466, the N-type source region 482, and the N-type drain region 494. A conductive layer (not shown) of interconnect metal or other conductive material can then be deposited in the contact holes and patterned to leave remaining portions that comprise the interconnection metallization to silicide regions (not illustrated) formed on the N-type source region 472, N-type anode region 466, the N-type source region 482 and the N-type drain region 494. Vias can then be formed that extend through another layer of insulating material to the interconnection metallization to provide an electrical pathway to interconnection metallization. A metal-1 layer can then be deposited overlying at least the vias and patterned to form a write enable line 430 that electrically contacts the gate electrode 465 and N-type base region 468 of the GLT device 460 and a supply line 432 that electrically contacts a silicide region of the P-type anode region 466 of the GLT device 460 and a silicide region formed on the N-type drain region 494 of the sensing transistor 490. Another layer of insulating material (not shown) can then be deposited overlying the write enable line 430 and the supply line 432, vias 451, 455 can be formed that extend through the insulating material, and a metal-2 layer can then be deposited overlying at least the vias 451, 455 and patterned to form a write bit line 452 that electrically contacts via 451 and a read bit line 454 that electrically contacts via 455.

Thus, as illustrated in FIGS. 4 and 22, the memory cell 410 comprises the GLT device 460, the NMOS write access transistor 470, the NMOS read access transistor 480 and the sensing transistor 490. The NMOS write access transistor 470 is fabricated adjacent the NMOS read access transistor 480 and the GLT device 460 on the semiconductor layer 406, and the sensing transistor 490 is fabricated adjacent the NMOS read access transistor 480 and the GLT device 460 on semiconductor layer 406.

The GLT device 420 comprises a lateral NPNP thyristor coupled to a MOS capacitor 463, 408, 465. The lateral NPNP thyristor comprises alternating N-type and P-type material which include a P-type anode region 466, an N-type base region 468, a P-type base region 463 and an N-type cathode region 464, where the base regions 463, 468 are laterally disposed between the P-type anode region 466 and N-type cathode region 464. A PN junction ($J_1$) is formed between P-type anode region 466 and the N-type base region 468, another PN junction ($J_2$) is formed between the N-type base region 468 and the P-type base region 463, and yet another PN junction ($J_3$) is formed between the P-type base 463 and the N-type cathode region 464. The MOS capacitor 463, 408, 465 of the GLT device 460 includes a gate electrode 465, the P-type base region 463, and a gate insulator layer 408 disposed between the gate electrode 465 and the P-type base region 463. The gate insulator layer 408 serves as the capacitor dielectric. The N-type base region 468 and the P-type base region 463 are adjacent one another. When the P-type anode region 466 is at a positive potential with respect to the N-type cathode region 464 (with no voltage applied at the gate electrode 465), then PN junction ($J_1$) and PN junction ($J_3$) are forward biased, while PN junction ($J_2$) is reverse biased. As PN junction ($J_2$) is reverse biased, no conduction takes place (off state). If a positive potential applied to the P-type anode region 466 is increased beyond a breakdown voltage ($V_{BK}$) of the thyristor, avalanche breakdown of PN junction ($J_2$) takes place and the thyristor starts conducting (on state). If a positive potential ($V_G$) is applied at the gate electrode 465 with respect to the N-type cathode region 464, the breakdown of the junction PN junction ($J_2$) occurs at a lower value of the positive potential. By selecting an appropriate value of $V_G$, the thyristor can be quickly switched into the on state.

The MOS capacitor 463, 408, 465 is capacitively coupled to the P-base region 463 of the thyristor, and holds charge thereby controlling potential of the P-base region 463 of the thyristor. The voltage level of the P-base region 463 determines whether or not NPN action of the N-type base region 468, the P-type base region 463, and the N-type cathode region 464 is triggered.

Although the example above is an NMOS embodiment, those skilled in the art will appreciated that an alternative PMOS embodiment can be fabricated by switching conductivity types of various regions that make up the devices. For example, in an alternative exemplary embodiment, the transistors 470, 480, 490 comprise PMOS transistors, and the GLT device 460 comprises a thyristor arranged in an PNPN configuration with the MOS capacitor is connected to an N-base of the thyristor. In the PMOS embodiment (not illustrated), the well regions 463, 471, 486, 493 are N-well regions, and exposed portions of N-well regions 463, 471, 486, 493 can be doped with P-type conductivity determining impurities to create lightly doped extension regions and source/drain regions in the semiconductor layer 406. Impurity doping can take place, for example, by the implantation and subsequent thermal annealing of dopant ions such as boron di-flouride ($BF_2$) for lightly doped extension regions and boron for source/drain regions.

As will be described below with reference to FIG. 23, memory cell 410 is operated using a plurality of control lines which include word line 420, write enable line 430, supply line 432, write bit line 452, and read bit line 454. This memory cell 410 arrangement, among other things, prevents read disturbances during read operations by decoupling the read and write bit lines 454, 452, as will be described below with reference to FIG. 23.

Figure 23:
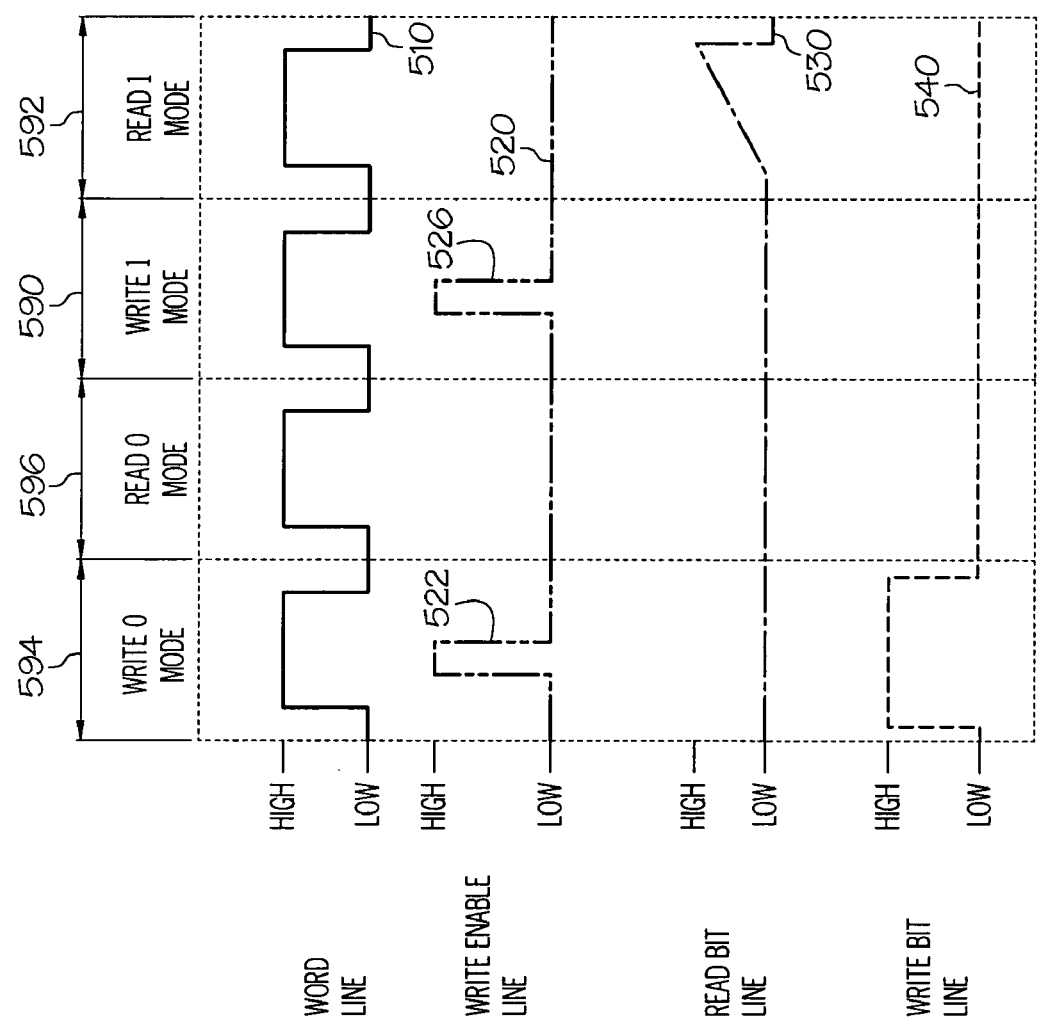
FIG. 23 is a timing diagram which illustrates voltages applied to control lines during operation of the memory cell of FIG. 4 in accordance with an embodiment of the present invention.

FIG. 23 is a timing diagram which illustrates voltage waveforms 510, 520, 530, 540 applied to control lines 420, 430, 454, 452 of the memory cell 410 of FIG. 4 during reading and writing operations of the memory cell 410 in accordance with an embodiment of the present invention. As described in detail below, the memory cell 410 can be operated in any one of a number of different modes including write one (1) mode 590, read one (1) mode 592, write zero (0) mode 594, and read zero (0) mode 596.

The memory cell 410 can be designed to operate using different voltages, and any values specified below are merely exemplary and provided to illustrate one particular non-limiting implementation. The power supply line 432 is grounded throughout operation of the memory cell 410, and therefore is not illustrated in FIG. 23. The voltage waveform 510 applied to the word line 420 ranges from a low value of approximately 0.0 volts to a high value of approximately 1.2 volts. Voltage waveform 510 transitions from the low value to the high value when the word line 420 is activated. The voltage waveform 520 applied to the write enable line 430 ranges from a low value of approximately −1.5 volts to a high value of approximately 0.0 volts. Voltage waveform 520 transitions from the low value to the high value when the write enable line 430 is activated during either a write one (1) operation that occurs during the write one (1) mode 590 or a write zero (0) operation that occurs during the write zero (0) mode 594. The voltage waveforms 530, 540 applied to the write and read bit lines 452, 454 range from a low value of approximately 0.0 volts to a high value of approximately 2.0 volts. In particular, voltage waveform 530 transitions from the low value to the high value when the read bit line 454 is activated during a read one (1) mode 592, and the voltage waveform 540 applied on the write bit line 452 transitions from the low value to the high value when the write bit line 452 is activated during the write zero (0) mode 594.

During either write operation, the memory cell 410 is selected or activated by applying high voltage (Vdd) to the word line 420, and applying a low voltage to the read bit line 454 to turn "off" the read access transistor 480 of the memory cell 410. When the write enable line 430 is at low voltage relative to the anode region 466 of the GLT device 460, no current flows in the GLT device 460 until a voltage pulse 522 (e.g., 0.0 volts) is applied to the write enable line 430. Writing operations take place by applying a voltage pulse 522, 526 to the write enable line 430, which causes a current to flow in the GLT device 460 allowing either a zero (0) or one (1) to be written to the memory cell 410.

For the write one (1) operation that occurs during the write one (1) mode 590, a low voltage, for example, between 0.0 volts to 0.5 volts, is applied to both the read and write bit lines 452, 454 thereby applying a low voltage to the source electrode 472 of the write access transistor 470 and the source electrode 482 of the read access transistor 480, and high voltage is applied to the word line 420 and hence to the gate electrodes 475, 485 of the write access transistor 470 and the read access transistor 480. The write enable line is coupled to the gated electrode 465 of the GLT device 460. A one (1) is written to the memory cell 410 when voltage pulse 526 is applied to the write enable line 430.

For the write zero (0) operation that occurs during the write zero (0) mode 594, high voltage is applied to the write bit line 452 thereby applying a high voltage to the source electrode 472 of the write access transistor 470, while the word line 420 is held at high potential thereby applying a high voltage to the gate electrodes 475, 485 of the write access transistor 470 and the read access transistor 480, and the read bit line 454 is held at low voltage thereby applying a low voltage to the source electrode 482 of the read access transistor 480. The write enable line 430 is coupled to the gated electrode 465 which is capacitively coupled to the p-base 463 of the GLT device 460. A zero (0) is written to the memory cell 410 when voltage pulse 522 is applied to the write enable line 430 since the voltage pulse 522 decreases the potential of the p-base 463 of the GLT device 460 thereby turning off the GLT device 460.

During either read operation, the memory cell 410 is selected or activated by applying high voltage to the word line 420, applying a low voltage to or grounding the write bit line 452, and applying low voltage to the write enable line 430 so that no current flows in the GLT device 460 thereby preventing a write operation from taking place. Because the write bit line 452 is kept at low voltage during read operations 592, 596 the read disturbance problem can be eliminated. Moreover, memory cell 410 can be operated without a periodic refreshing operation because the current between cathode region 464 and anode region 466 is not limited during the standby mode or "holding state" that occurs between read operations 596, 592 and write operations 594, 590.

For the read one (1) operation that occurs during the read one (1) mode 592, the memory cell 410 will have previously been written with a one (1). The GLT device 460 will be in a high state (also referred to as a "forward breaking mode") that raises the potential of the node 444 between GLT device 460 and the write access transistor 474. High potential at node 444 turns the sensing transistor 490 "on." The read bit line 454 is pre-charged to ground (0.0 volts). When high voltage is applied to the word line 420 the read access transistor 480 turns on, and the sensing transistor 490 and read access transistor 480 allow a current to pass from the anode 466 to read bit line 454 via supply line 432. When the voltage applied on bit line 454 increases, the sense amplifier circuit 346 senses that data one (1) is being read from the memory cell 410.

For the read zero (0) operation that occurs during the read zero (0) mode 596, the memory cell 410 will have previously been written with a zero (0). The GLT device 460 will be in a low state (also referred to as a "reverse breaking mode"). The potential at node 444 between GLT device 460 and the write access transistor 474 is approximately zero and no current is passing through the GLT device 460. When zero bias at node 444 is applied to the sensing transistor 490, the sensing transistor 490 will be in its "off" state and current can not flow from the anode 466 to the read bit line 454. If the voltage on the pre-charged read bit line 454 does not change, then the sense amplifier circuit 346 senses that data zero (0) is being read from the memory cell 410.

Figure 24:
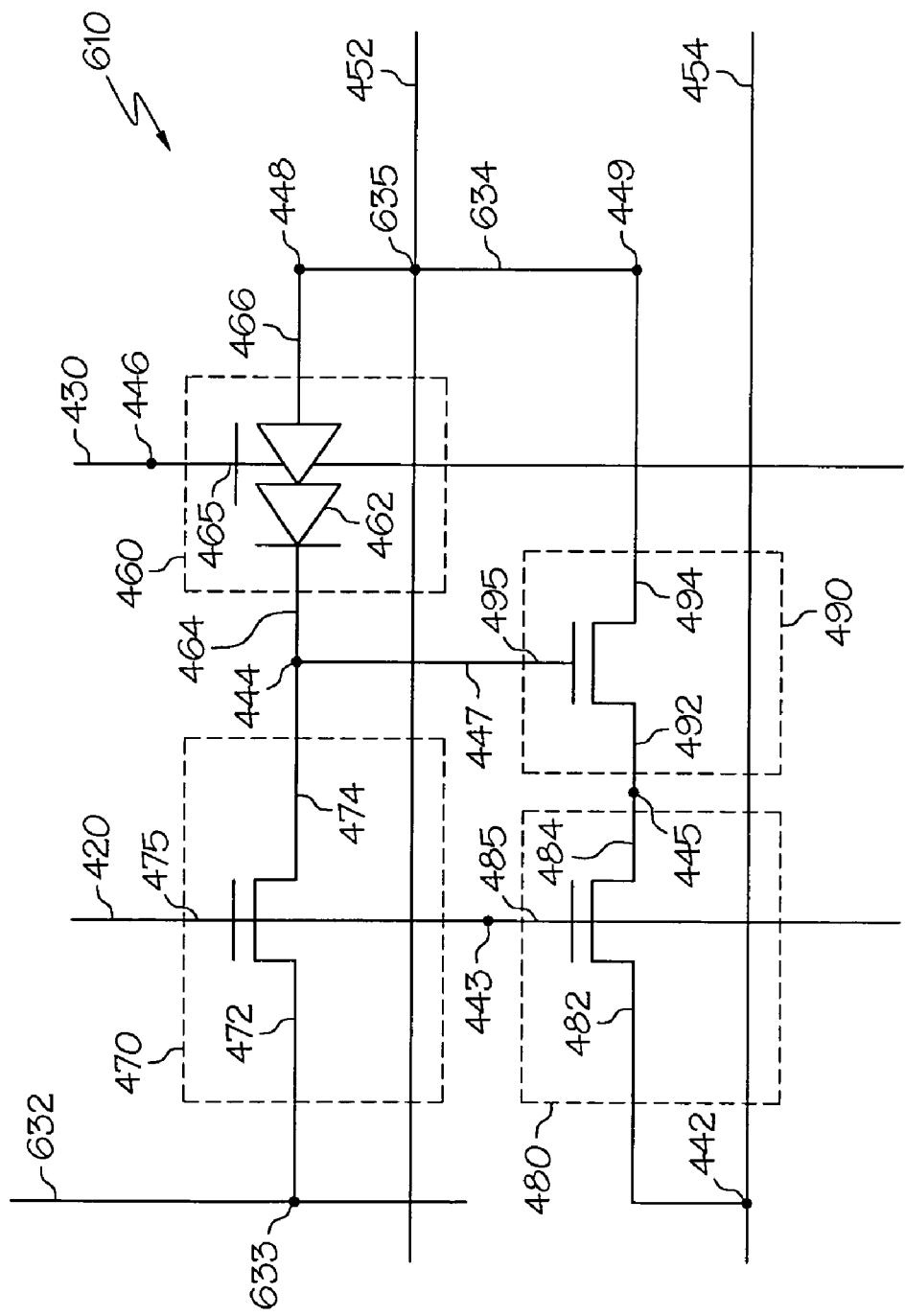
FIG. 24 is a circuit schematic which illustrates a memory cell in accordance with another embodiment of the present invention.

FIG. 24 is a circuit schematic which illustrates a memory cell 610 in accordance with another embodiment of the present invention. The memory cell 610 of FIG. 24 includes many of the same elements and interconnections as the memory cell 410 of FIG. 4. The same reference numerals used in FIG. 4 are reused in FIG. 24 unless the arrangement or structure of memory cell 610 has changed. For sake of brevity, commonly numbered elements in FIGS. 4 and 24 will not be described in detail here again, and only the differences between the memory cell 610 of FIG. 24 and that of FIG. 4 will be described below. As in FIG. 4, the memory cell 610 comprises a gated lateral thyristor (GLT) device 460, a write access transistor 470, a read access transistor 480 and a sensing transistor 490, and a plurality of control lines are used to operate the memory cell 610 including a word line 420, a write enable line 430, a supply line 632, a write bit line 452, and a read bit line 454.

The memory cell 610 illustrated in FIG. 24 differs from the memory cell 410 of FIG. 4 in that the supply line 632 is relocated such that it is coupled to the source electrode 472 of the write access transistor 470 at node 633. In addition, the anode 466 of the GLT device 460 and drain 494 of the sensing transistor 490 are coupled to one another via conductive line 634 that couples node 448 to node 449. Nodes 448, 449 are also coupled to the write bit line 452 at node 635. The sensing transistor 490 senses the voltage at node 444 a similar way as described above with respect to FIG. 4, the write access transistor 470 controls write access in a similar way as described above with respect to FIG. 4, and the read access transistor 470 controls read access in a similar way as described above with respect to FIG. 4. As such, operation of these elements will not be described herein again. As in FIG. 4, the memory cell 610 can eliminate the read disturbance problem mentioned above by providing separate write and read bit lines 452, 454 to decouple the read and write paths from one. Operation of the memory cell 610 will be described in greater detail below with reference to FIG. 26 following a description of method steps used to fabricate the memory cell 610.

Figure 25:
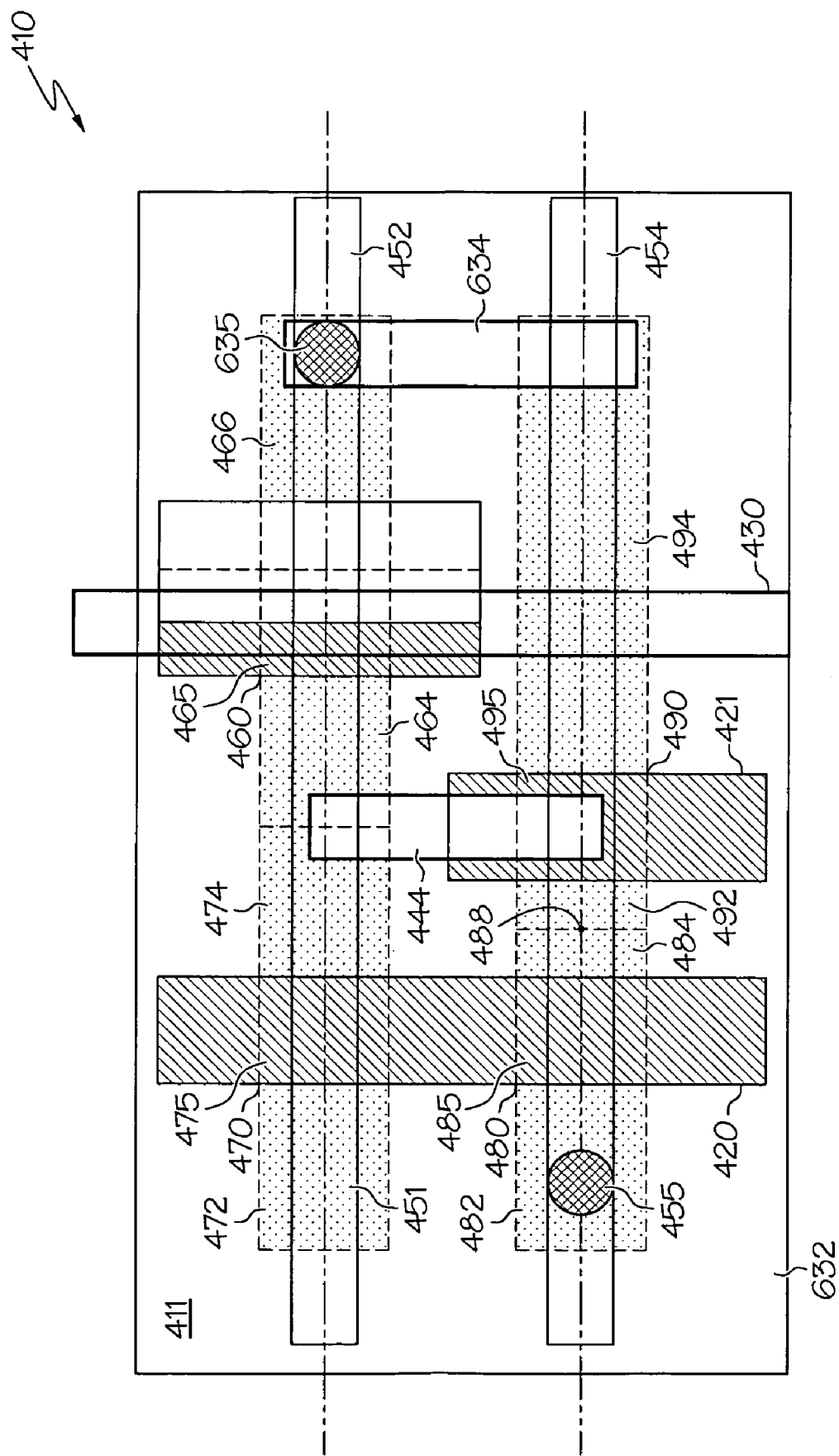

FIGS. 5-21 and 25 illustrate a memory cell 610 and method steps for its fabrication in accordance with various embodiments of the invention. FIGS. 5-21 have been described above, and for sake of brevity will not be repeated. Method steps for the fabrication of memory cell 610 will now be described with reference to FIG. 25, which illustrates a top plan view of the memory cell 610. In the alternative memory cell 610 layout of FIG. 25, a metal-1 layer is deposited overlying the vias 442, 446, 448, 449 and remaining portions of the layer of insulating material 409, and patterned, for example by etching, to form a supply line 632, a write enable line 430 and metal line 634 that couples via 448 to via 449. Via 448 electrically contacts contacts a silicide region (not illustrated) formed on the P-type anode 466 of the GLT device 460, and via 449 electrically contacts a silicide region (not illustrated) formed on the N-type drain region 494 of the sensing transistor 490. The supply line 632 electrically contacts via 441, which electrically contacts a silicide region (not illustrated) of the source electrode 472 of the write access transistor 470. Another layer of insulating material (not illustrated) is deposited overlying the insulating material 409, the supply line 632, the write enable line 430 and metal line 634, and portions of the insulating material are then anisotropically etched to form a via hole that extends through the insulating material 411 to via 442 and the metal line 634. The via hole can then be filled with conductive material to form a via that electrically contacts the via 442 and the metal line 634. Thereafter, a metal-2 layer (not shown) can then be deposited overlying at least vias 455, 635 and remaining portions of the layer of insulating material, and patterned to form a write bit line 452 that electrically contacts via 635 and a read bit line 454 that electrically contacts via 455.

Figure 26:
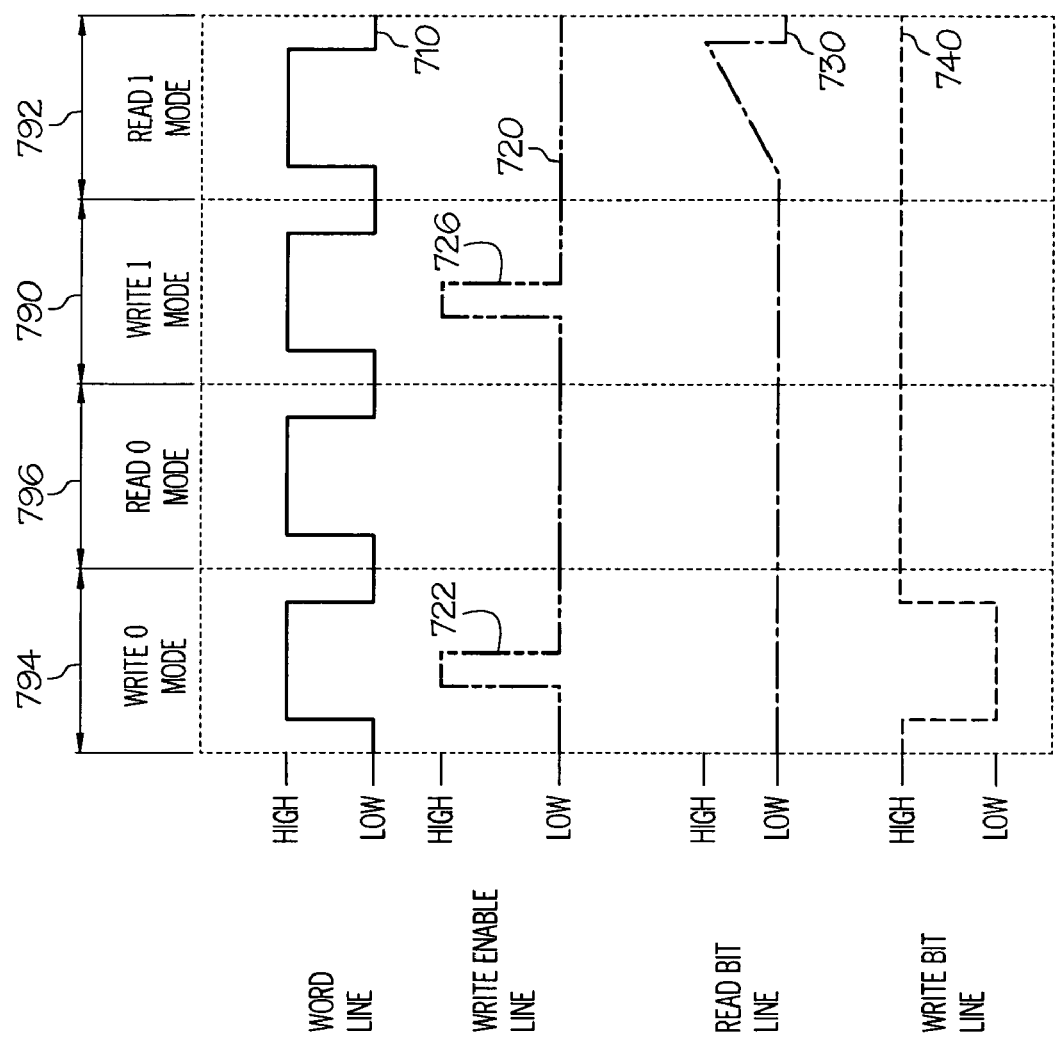
FIG. 26 is a timing diagram which illustrates voltages applied to control lines during operation of the memory cell of FIG. 24 in accordance with an embodiment of the present invention.

FIG. 26 is a timing diagram which illustrates voltage waveforms 710, 720, 730, 740 applied to control lines 420, 430, 454, 452 of the memory cell 610 of FIG. 24 during reading and writing operations of the memory cell 610 in accordance with an embodiment of the present invention. As described in detail below, the memory cell 610 can be operated in any one of a number of different modes including write one (1) mode 790, read one (1) mode 792, write zero (0) mode 794, and read zero (0) mode 796.

The memory cell 610 can be designed to operate using different voltages, and any values specified below are merely exemplary and provided to illustrate one particular non-limiting implementation. The power supply line 632 is grounded throughout operation of the memory cell 610, and therefore is not illustrated in FIG. 26. The voltage waveform 710 applied to the word line 420 ranges from a low value of approximately 0.0 volts to a high value of approximately 1.2 volts. Voltage waveform 710 transitions from the low value to the high value when the word line 420 is activated. The voltage waveform 720 applied to the write enable line 430 ranges from a low value of approximately −1.5 volts to a high value of approximately 0.0 volts. Voltage waveform 720 transitions from the low value to the high value when the write enable line 430 is activated during either a write one (1) operation that occurs during the write one (1) mode 790 or a write zero (0) operation that occurs during the write zero (0) mode 794. The voltage waveforms 730, 740 applied to the write and read bit lines 452, 454 range from a low value of approximately 0.0 volts to a high value of approximately 1.2 volts. In particular, voltage waveform 730 transitions from the low value of zero (0) volts to the high value of 1.0 volts when the read bit line 454 is activated during a read one (1) mode 792, and the voltage waveform 740 applied on the write bit line 452 transitions from the high value to the low value when the write bit line 452 is activated during the write zero (0) mode 790.

During either write operation, the memory cell 610 is selected or activated by applying high voltage (Vdd) to the word line 420, and applying a low voltage to the read bit line 454 to turn "off" the read access transistor 480 of the memory cell 610. When the write enable line 430 is at low voltage relative to the anode region 466 of the GLT device 460, no current flows in the GLT device 460 until a voltage pulse 722 (e.g., 0.0 volts) is applied to the write enable line 430. Writing operations take place by applying a voltage pulse 722, 726 to the write enable line 430, which causes a current to flow in the GLT device 460 allowing either a zero (0) or one (1) to be written to the memory cell 610.

For the write one (1) operation that occurs during the write one (1) mode 790, a low voltage, for example, between 0.0 volts to 0.5 volts, is applied to the read bit line 454 thereby applying a low voltage to the source electrode 482 of the read access transistor 480, a high voltage, for example, between 1.0 volts and 1.5 volts, is applied to both the write bit line 452 thereby applying a high voltage to the source electrode 472 of the write access transistor 470, and high voltage is applied to the word line 420 and hence to the gate electrodes 475, 485 of the write access transistor 470 and the read access transistor 480. The write enable line is coupled to the gated electrode 465 of the GLT device 460. A one (1) is written to the memory cell 610 when voltage pulse 726 is applied to the write enable line 430.

For the write zero (0) operation that occurs during the write zero (0) mode 794, a low voltage between 0.0 volts and 0.5 volts is applied to the write bit line 452 thereby applying a low voltage to the source electrode 472 of the write access transistor 470, while the word line 420 is held at high potential thereby applying a high voltage to the gate electrodes 475, 485 of the write access transistor 470 and the read access transistor 480, and the read bit line 454 is held at low voltage thereby applying a low voltage to the source electrode 482 of the read access transistor 480. The write enable line 430 is coupled to the gated electrode 465 which is capacitively coupled to the p-base 463 of the GLT device 460. A zero (0) is written to the memory cell 610 when voltage pulse 722 is applied to the write enable line 430 since the voltage pulse 722 decreases the potential of the p-base 463 of the GLT device 460.

During either read operation, the memory cell 610 is selected or activated by applying high voltage to the word line 420, applying a high voltage to the write bit line 452, and applying low voltage to the write enable line 430 so that no current flows in the GLT device 460 thereby preventing a write operation from taking place. Because the write bit line 452 is kept at high voltage during read operations 792, 796 the read disturbance problem can be eliminated. Moreover, memory cell 610 can be operated without a periodic refreshing operation because the current between anode and cathode 464 is not limited during the standby mode or "holding state" that occurs between read operations 796, 792 and write operations 794, 790.

For the read one (1) operation that occurs during the read one (1) mode 792, the memory cell 610 will have previously been written with a one (1). The GLT device 460 will be in a high state (also referred to as a "forward breaking mode") that raises the potential of the node 444 between GLT device 460 and the write access transistor 474. High potential at node 444 turns the sensing transistor 490 "on." The read bit line 454 is pre-charged to ground (0.0 volts). When high voltage is applied to the word line 420 the read access transistor 480 turns on, and the sensing transistor 490 and read access transistor 480 allow a current to pass from the anode 466 to write bit line 452 and to the drain 494 of sensing transistor 490 via line 634. When the voltage applied on bit line 454 increases, the sense amplifier circuit 346 senses that data one (1) is being read from the memory cell 610.

For the read zero (0) operation that occurs during the read zero (0) mode 796, the memory cell 610 will have previously been written with a zero (0). The GLT device 460 will be in a low state (also referred to as a "reverse breaking mode"). The potential at node 444 between GLT device 460 and the write access transistor 474 is approximately zero and no current is passing through the GLT device 460. When zero bias at node 444 is applied to the sensing transistor 490, the sensing transistor 490 will be in its "off" state and current can not flow from the anode 466 to the write bit line 452 and to the drain 494 of sensing transistor 490 via line 634. If the voltage on the pre-charged read bit line 454 does not change, then the sense amplifier circuit 346 senses that data zero (0) is being read from the memory cell 610.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A memory cell, comprising:
    a gated-lateral thyristor (GLT) device;
    a write access transistor, coupled to the gated-lateral thyristor (GLT) device, for controlling write access; and
    a read access transistor, directly coupled to the write access transistor, for controlling read access.

2. A memory cell according to claim 1, further comprising:
    a sensing transistor, coupled to the GLT device, the write access transistor and to the read access transistor.

3. A memory cell according to claim 2, wherein the write access transistor, the read access transistor and the sensing transistor each comprise:
    P-channel field effect transistors.

4. A memory cell according to claim 2, wherein the write access transistor, the read access transistor and the sensing transistor each comprise:
    N-channel field effect transistors.

5. A memory cell according to claim 3, wherein the GLT device comprises:
    an NPNP device comprising a first N-region and a second N-region;
    a capacitor coupled to the second N-region.

6. A memory cell according to claim 4, wherein the GLT device comprises:
    an PNPN device comprising a first P-region and a second P-region;
    a capacitor coupled to the second P-region.

7. A memory cell according to claim 4, wherein the write access transistor is coupled to a first node, wherein the read access transistor is coupled to a second node and is directly coupled to the write access transistor at a third node, wherein the gated-lateral thyristor (GLT) device is coupled to the write access transistor at a fourth node, wherein the sensing transistor is coupled to the GLT device and the write access transistor at the fourth node and to the read access transistor at a fifth node.

8. A memory cell according to claim 7, wherein the write access transistor further comprises:
    a first source electrode coupled to the first node;
    a first drain electrode coupled to the fourth node; and
    a first gate electrode.

9. A memory cell according to claim 8, wherein the GLT device comprises:
    a cathode node coupled to the first drain electrode at the fourth node;
    a gated electrode coupled to a sixth node; and
    an anode node coupled to the sensing transistor.

10. A memory cell according to claim 9, wherein the read access transistor comprises:
    a second source electrode coupled to the second node;
    a second drain electrode coupled to the fifth node; and
    a second gate electrode coupled to and integral with the first gate electrode.

11. A memory cell according to claim 10, wherein the sensing transistor comprises:
    a third source electrode coupled to the second drain electrode at the fifth node;
    a third drain electrode coupled to the anode node at a seventh node; and
    a third gate electrode coupled to the first drain electrode and the cathode at the fourth node.

12. A memory device, comprising:
    a supply line;
    a write bit line;
    a read bit line;
    a write access transistor coupled to one of the write bit line and the supply line;
    a read access transistor coupled to the read bit line and directly coupled to the write access transistor; and
    a gated-lateral thyristor (GLT) device coupled to the write access transistor.

13. A memory device according to claim 12, further comprising:
    a sensing transistor coupled to the GLT device, the write access transistor, and the read access transistor.

14. A memory device according to claim 13, further comprising:
    a write enable line coupled to the GLT device.

15. A memory device according to claim 14, wherein the write access transistor comprises a first gate electrode, and wherein the read access transistor comprises a second gate electrode, and further comprising:
    a first word line comprising the first gate electrode and the second gate electrode.

16. A memory device according to claim 15, wherein the write access transistor further comprises:
    a first source electrode coupled to the write bit line;
    a first drain electrode; and
    a first gate electrode comprising a portion of the first word line.

17. A memory device according to claim 15, wherein the write access transistor further comprises:
    a first source electrode coupled to the supply line;
    a first drain electrode; and
    a first gate electrode comprising a portion of the first word line.

18. A memory device according to claim 16, wherein the read access transistor comprises:
    a second source electrode coupled to the read bit line;
    a second drain electrode; and
    a second gate electrode comprising another portion of the first word line, wherein the second gate electrode and the first gate electrode are formed from a common conductive layer.

19. A memory device according to claim 18, wherein the sensing transistor comprises:
    a third source electrode coupled to the second drain electrode;
    a third gate electrode coupled to the first drain electrode and the cathode; and
    a third drain electrode coupled to the supply line.

20. A memory device according to claim 19, wherein the GLT device comprises:
    a cathode node coupled to the first drain electrode;
    a gated electrode coupled to the write enable line; and
    an anode node coupled to the supply line.

21. A memory device according to claim 17, wherein the read access transistor comprises:
    a second source electrode coupled to the read bit line;
    a second drain electrode; and
    a second gate electrode comprising another portion of the first word line, wherein the second gate electrode and the first gate electrode are formed from a common conductive layer.

22. A memory device according to claim 21, wherein the GLT device comprises:
    a cathode node coupled to the first drain electrode;
    a gated electrode coupled to the write enable line; and
    an anode node coupled to the write bit line.

23. A memory device according to claim 22, wherein the sensing transistor comprises:
    a third source electrode coupled to the second drain electrode; and
    a third gate electrode coupled to the first drain electrode and the cathode; and
    a third drain electrode coupled to the write bit line and the anode node.

24. A memory device, comprising:
    a write enable line;
    a write bit line;
    a read bit line;
    a first transistor comprising a first gate electrode, a first source electrode, and a first drain electrode;
    a second transistor comprising a second source electrode coupled to the first gate electrode and to the read bit line, a second gate electrode coupled to the first gate electrode, and a second drain electrode;
    a gated-lateral thyristor (GLT) device comprising an anode node, a gated electrode coupled to the write enable line, and a cathode node coupled to the first drain electrode; and
    a third transistor comprising a third drain electrode, a third source electrode coupled to the second drain electrode, and a third gate electrode coupled to the first drain electrode and to the cathode at a common node.

25. A memory device according to claim 24, further comprising:
    a supply line coupled to the anode node and to the third drain electrode, and wherein the write bit line is coupled to the first source electrode.

26. A memory device according to claim 24, further comprising:
    a supply line coupled to the first source electrode, wherein the anode node is coupled to the third drain electrode, and wherein the write bit line is coupled to the anode node and to the third drain electrode.

* * * * *